(12) United States Patent
Hébert

(10) Patent No.: US 7,893,488 B2
(45) Date of Patent: Feb. 22, 2011

(54) CHARGED BALANCED DEVICES WITH SHIELDED GATE TRENCH

(75) Inventor: François Hébert, San Mateo (CA)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 183 days.

(21) Appl. No.: 12/321,435

(22) Filed: Jan. 21, 2009

(65) Prior Publication Data

US 2010/0044792 A1 Feb. 25, 2010

Related U.S. Application Data

(63) Continuation-in-part of application No. 12/229,250, filed on Aug. 20, 2008, now Pat. No. 7,790,549.

(51) Int. Cl.
*H01L 29/66* (2006.01)
(52) U.S. Cl. .................. 257/330; 257/331; 257/332; 257/E21.09
(58) Field of Classification Search ............. 257/330, 257/331, 332, E21.09
See application file for complete search history.

(56) References Cited

U.S. PATENT DOCUMENTS

| | | | |
|---|---|---|---|
| 7,554,155 B2 * | 6/2009 | Saito et al. | 257/341 |
| 2008/0038850 A1 * | 2/2008 | Yamaguchi et al. | 438/17 |

* cited by examiner

*Primary Examiner*—Tan N Tran
(74) *Attorney, Agent, or Firm*—Bo-In Lin

(57) ABSTRACT

This invention discloses a semiconductor power device disposed on a semiconductor substrate includes a plurality of deep trenches with an epitaxial layer filling said deep trenches and a simultaneously grown top epitaxial layer covering areas above a top surface of said deep trenches over the semiconductor substrate. A plurality of trench MOSFET cells disposed in said top epitaxial layer with the top epitaxial layer functioning as the body region and the semiconductor substrate acting as the drain region whereby a super-junction effect is achieved through charge balance between the epitaxial layer in the deep trenches and regions in the semiconductor substrate laterally adjacent to the deep trenches. Each of the trench MOSFET cells further includes a trench gate and a gate-shielding dopant region disposed below and substantially aligned with each of the trench gates for each of the trench MOSFET cells for shielding the trench gate during a voltage breakdown.

20 Claims, 22 Drawing Sheets

CHARGED BALANCED DEVICES WITH SHIELDED GATE TRENCH

This Patent Application is a Continuation in Part (CIP) Application of Ser. No. 12/229,250 filed by a common Inventor of this Application on Aug. 20, 2008 now U.S. Pat. No. 7,790,549. The disclosure made in that Application is hereby incorporated by reference.

BACKGROUND OF THE INVENTION

1. Field of the Invention

The invention relates generally to vertical semiconductor power devices. More particularly, this invention relates to configurations and methods implemented with a single thin epitaxial layer with improved manufacturability for manufacturing flexibly scalable charge balanced vertical semiconductor power devices with a super-junction structure and shielded gate trench with simple manufacturing processes flexibly adjustable for applications to different targeted breakdown voltages.

2. Description of the Prior Art

Conventional manufacturing technologies and device configuration to further increase the breakdown voltage with reduced series resistance are still confronted with manufacturability difficulties. The practical applications and usefulness of the high voltage semiconductor power devices are limited due to the facts that the conventional high power devices generally have structural features that require numerous time-consuming, complex, and expensive manufacturing processes. As will be further discussed below, some of the processes for manufacturing the high voltage power devices are complicated thus having low throughput and low yields. Furthermore, instead of using a raw semiconductor wafer, the semiconductor power devices are generally fabricated with preprocessed wafer formed with an epitaxial layer thereon. The production costs of the semiconductor power devices are therefore increased. Also, the functionality and performance characteristics are often dictated by the process parameters applied in forming this epitaxial layer. For these reasons, the application of such preprocessed wafers further limits the manufacturability and the production flexibility of the power devices that are now dependent on the original preprocessed wafer employed to manufacture the semiconductor power devices.

In comparison to conventional technologies, the super-junction technologies have advantages to achieve higher breakdown voltage (BV) without unduly increasing the drain-to-source on resistance, Rdson. For standard power transistor cells, breakdown voltage is supported largely on the low doped drift layer. Therefore, the drift layer is made with greater thickness and more resistive at higher voltage ratings. However this has the effect of greatly increasing the Rdson. In conventional power devices, the Rdson has approximately a functional relationship represented by:

$Rdson \propto BV^{2.5}$

In contrast, a device having a super-junction configuration is implemented with a charge balanced drift region. The resistance Rdson has a more favorable functional relationship with the breakdown voltage. The functional relationship can be represented as:

$Rdson \propto BV$

For high voltage applications, it is therefore desirable to improve the device performance by designing and manufacturing the semiconductor power devices with super-junction configurations for reducing the resistance Rdson while achieving high breakdown voltage. Regions adjacent to the channel within the drift region are formed with an opposite conductivity type. The drift region may be relatively highly doped, so long as the regions adjacent to the channel are similarly doped but of an opposite conductivity type. During the off-state, the charges of the two regions balance out such that the drift region becomes depleted, and can support a high voltage. This is referred to as the super-junction effect. During the on-state, the drift region has a lower resistance Rdson because of a higher doping concentration.

However, conventional super-junction technologies still have technical limitations and difficulties when implemented to manufacture the power devices. Specifically, multiple epitaxial layers and/or buried layers are required in some of the conventional structures. Multiple etch back and chemical mechanical polishing (CMP) processes are necessary in many of the device structures according to the previous manufacturing processes. Furthermore, the manufacturing processes often require equipment not compatible with standard foundry processes. For example, many standard high-volume semiconductor foundries have oxide CMP (chemical mechanical polishing) but do not have silicon CMP, which is required for some superjunction approaches. Additionally, these devices have structural features and manufacturing processes not conducive to scalability for low to high voltage applications. In other words, some approaches would become too costly and/or too lengthy to be applied to higher voltage ratings. As will be further reviewed and discussions below, these conventional devices with different structural features and manufactured by various processing methods, each has limitations and difficulties that hinder practical applications of these devices as now demanded in the marketplace.

A conventional type of semiconductor power device for high voltage applications includes those devices formed with standard structures as depicted in FIG. 1A for a standard VDMOS that do not incorporate the functional feature of charge balance. For this reason, there is no breakdown voltage enhancement beyond the one-dimensional theoretical figure of merit, i.e., the Johnson limit, according to the I-V (current-voltage) performance measurements and further confirmed by simulation analyses of this type of devices. The devices with this structure generally have relatively high on-resistance due to the low drain drift region doping concentration in order to satisfy the high breakdown voltage requirement. In order to reduce the on resistance Rdson, this type of device generally requires large die size. Despite the advantages that the devices can be manufactured with simple processes and low manufacturing cost, these devices are however not feasible for high current low resistance applications in the standard packages due the above discussed drawbacks: the die cost becomes prohibitive (because there are too few dies per wafer) and it becomes impossible to fit the larger die in the standard accepted packages.

A second type of devices includes structures provided with two-dimensional charge balance to achieve a breakdown voltage higher than the Johnson limit for a given resistance, or a lower specific resistance (Rdson*Area product) than the Johnson limit for a given breakdown voltage. This type of device structure is generally referred to as devices implemented with the super junction technology. In the super junction structure, a charge-balance along a direction parallel to the current flow in the drift drain region of a vertical device, based on PN junctions and field plate techniques implemented in oxide bypassed devices to enable a device to achieve a higher breakdown voltage.

FIG. 1B is a cross sectional view of a device with super junction to reduce the specific resistance (Rsp, resistance times active area) of the device by increasing the drain dopant concentration in the drift region while maintaining the specified breakdown voltage. The charge balance is achieved by providing P-type (for n-channel devices) vertical columns formed in the drain to result in lateral and complete depletion of the drain at high voltage to thus pinch off and shield the channel from the high voltage drain at the N+ substrate. Such technologies have been disclosed in Europe Patent 0053854 (1982), U.S. Pat. No. 4,754,310, specifically in FIG. 13 of that Patent, and U.S. Pat. No. 5,216,275. In these previous disclosures, the vertical super junctions are formed as vertical columns of N and P type dopant. In vertical DMOS devices, the vertical charge balance is achieved by a structure with sidewall doping to form one of the doped columns as were illustrated in drawings. In addition to doped columns, doped floating islands have been implemented to increase the breakdown voltage or to reduce the resistance as disclosed by U.S. Pat. No. 4,134,123 and U.S. Pat. No. 6,037,632. Such device structure of super junction still relies on the depletion of the P-regions to shield the gate/channel from the drain. The floating island structure is limited by the technical difficulties due to charge storage and switching issues.

For super junction types of devices as described above, the method of manufacturing are generally very complex, expensive and require long processing time due to the facts that the methods require multiple steps and several of these steps are slow and have a low throughput. Specifically, the steps may involve multiple epitaxial layers and buried layers. Some of the structures require deep trenches through the entire drift region and require etch back or chemical mechanical polishing in most these processes. For these reasons, the conventional structures and manufacture methods are limited by slow and expensive manufacturing processes and are not economical for broad applications.

In U.S. application Ser. No. 12/005,878 filed by the inventor of this application, of which this application is a Continuation-In-Part, a super junction device with charge-balancing epitaxial columns grown in deep trenches is disclosed. Trench metal oxide semiconductor field effect transistors (MOSFET) are formed in the top epitaxial layer grown over the deep trenches and the areas surrounding the deep trenches. However the trench gate of this device may experience high electric fields and may be vulnerable to damage during voltage breakdowns.

Thus, in addition to the demands to improve the configurations and the methods of manufacture for the super-junction devices, there is also a requirement to shield the sensitive gates during the breakdown for the active cells. FIGS. 1C-1 to 1C-3 show the devices disclosed in U.S. Pat. No. 6,635,906 with devices formed with P-floating islands 1 in the bulk layer of the epitaxial layer. These P-floating islands are however not self-aligned to the gate or to trenches and have less effectiveness during the voltage breakdown in protecting the sensitive trench gates. FIG. 1D shows a figure disclosed by Takaya et. al., in their paper "Floating Island and Thick Bottom Oxide Trench Gate MOSFET (FITMOS)," at the 17th International Symposium on Power Semiconductor Devices & IC's in 2005, showing the floating P-regions implanted for charge balancing the drain and the P-region at the bottom of the trench gates are applied to separate the gate from the P-region. However, these p-implant regions below the trench gates are in contact with the gate trenches with a thick bottom oxide and may reduce the amount of current that can pass through during on operation.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved device structure and manufacturing method to form the doped columns in the drift regions for charge balance with simple and convenient processing steps. There are no etch-backs or CMP (chemical mechanical polishing) required thus reducing the processing steps and can be implemented with just forming a single thin epitaxial layer, simultaneously grown in and over deep trenches and on the top surface on the areas surrounding the deep trenches to achieve the super junction structure. The portion of the epitaxial layer in the trenches forms the epitaxial columns. The portion of the epitaxial layer grown over the deep trenches and over the top surface on the areas surrounding the deep trenches form the thin top epitaxial layer, in which trench MOSFET cells are formed. Both portions of the epitaxial layer may be grown at the same time as a single epitaxial layer. The trench gates of the transistor cells are further shielded with doped shielding regions implanted through the trench gates into the drift region below the gate thus forming self-aligned dopant shielding regions to shield the sensitive gates during the voltage breakdown therefore the above discussed difficulties and limitations are resolved. The doped shielding regions reduce the peak electric field at the trench gates; they also reduce the impact ionization rate and increase the breakdown voltage. The resulting structure has improved reliability and stability of electrical parameters. The doped shielding regions are formed under the accumulation region below the trench gates, and do not need to contact the trench gates. An additional dopant layer below the gate trench having the same conductivity type as the accumulation region can ensure that the doped shielding region does not contact the gate trench, which may allow more current to pass through when the device is switched on.

It is another aspect of this invention that the structure and configuration of the super-junction structure as that disclosed in this invention may be implemented with flexibly adjustable ranges of the targeted breakdown voltages. The manufacturing processes are simplified and can be conveniently manufactured with standard processing using standard processing modules and equipment. The manufacturing processes are further simplified because the transistor portion of the structure, e.g., the trench gate double-diffused metal oxide semiconductor (DMOS), is self-aligned. Therefore, the above discussed technical difficulties and limitations can be resolved.

Specifically, it is an aspect of the present invention to provide a new and improved device structure and manufacturing method to form the epitaxial layer in deep trenches with a thin top epitaxial layer portion covering over the top surface of the device. A portion of this epitaxial layer also serves as the body region of the MOSFET (p-type in the case of n-channel MOSFET). Furthermore, the MOSFET cells are formed in this top thin epitaxial layer as trench MOSFET. Trench gates are opened through the top thin epitaxial layer with optional trench sidewalls and trench bottom dopant implant zones to eliminate the sensitivity of the channel performance that may be affected by the depth of the trench gates and the dopant concentration of the epitaxial layer. A plurality of doped shielding regions are also implanted through the gate trenches into the drift region beneath the gates before the gate trenches are filled with a gate polysilicon layer. The doped shielding regions are of the same conductivity type as the body region of the MOSFET and function as gate shielding dopant regions which are self-aligned with the gate trenches. The doped shielding regions may be floating islands, or they may be tied (biased) to the epitaxial layer in the deep trenches and thus tied to the body region. Typically, floating islands are less desirable because they trap charges and make the device drift; the trapped charges also slow electrical transitions since the trapped charges take time to diffuse out. The performance of the transistor cells can be well controlled and adjusted by simplified and convenient processing steps. The super-junction configurations disclosed in this invention is further scalable for broad ranges of applications.

It is another aspect of the present invention to provide a new and improved device structure and manufacturing method to form the power transistor cells on a thin top layer formed as an epitaxial layer covering over the deep trenches and over the top surface surrounding and above the deep trenches. Ion implantation (having an opposite conductivity type as the epitaxial layer filling the deep trenches) through the deep trench sidewalls may adjust the dopant concentration of the drift regions surrounding the deep trenches to adjust and control the device performance parameters including the charge balance, Rdson and breakdown voltage. The ion implantation thus provides charge control to further adjust and fine tune the performance of the semiconductor power devices for different types of applications.

It is another aspect of the present invention to provide new and improved device structure and manufacturing method to form the power transistor cells with shallow trench gates on thin top P-epitaxial layer covering over vertical trenches on the top surface surrounding areas above the vertical trenches. Flexible device channel performance can be adjusted and implemented with a trench bottom dopant implant and sidewall dopant implants. The sidewall dopant implants and the trench bottom implant are applied to compensate the P-epitaxial and to assure appropriate accumulation and the channel regions. Before the gate trenches are filled with the polysilicon gate layer, an ion implant is carried out through the bottom surface of the gate trenches. The vertical implantation is applied to form the gate shielding dopant regions to shield the sensitive trench gates during the voltage breakdown.

It is another aspect of the present invention to provide new and improved device structure and manufacturing method to form the power transistor cells with deeper trench gates in a thin top layer formed as an epitaxial layer covering over epitaxial columns and on the top surface surrounding areas above the epitaxial columns. The trench gates penetrate through the top thin epitaxial layer and extend into the substrate regions thus a trench bottom dopant implant for connecting to the accumulation region may no longer be necessary. The trench gates are still shielded by the gate-shielding dopant regions implanted through the bottom surfaces of the gate trenches to form aligned dopant regions for shielding the sensitive trench gates during a voltage breakdown. A trench bottom dopant implant may still be used to ensure that the gate-shielding dopant regions do not contact the gate trenches.

Briefly in a preferred embodiment this invention discloses a semiconductor power device that includes a semiconductor substrate includes a plurality of deep trenches. An epitaxial layer fills the deep trenches; the epitaxial layer further includes a simultaneously grown top epitaxial layer covering areas above a top surface of the deep trenches and over the semiconductor substrate. The epitaxial layer is of an opposite conductivity type as the semiconductor substrate. A plurality of trench MOSFET cells are formed in the top epitaxial layer with the top epitaxial layer acting as the body region and the semiconductor substrate acting as the drain region whereby a super-junction effect is achieved through charge balance between the epitaxial layer in the deep trenches and regions in the semiconductor substrate laterally adjacent to the deep trenches. Each of the plurality of trench MOSFET cells further includes a trench gate and a gate-shielding dopant region disposed below and substantially self-aligned with each of the trench gates for each of the trench MOSFET cells for shielding the trench gate during a voltage breakdown. In an exemplary embodiment, each of the trench gates of the trench MOSFET cells is opened through the top epitaxial layer and filled with a gate dielectric material and a gate conductor material. In another exemplary embodiment, each of the trench gates of the trench MOSFET cells is through the top epitaxial layer and penetrating into a top portion of the semiconductor substrate having a gate trench depth greater than or equal to a thickness of the top epitaxial layer and the trench gate is filled with a gate dielectric material and a gate conductor material. In another exemplary embodiment, the trench gate further comprises gate sidewall dopant regions surrounding sidewalls of the trench gate and a gate-bottom dopant region below the trench gate, wherein the gate sidewall dopant regions and gate-bottom dopant regions are of same conductivity type as the semiconductor substrate. In another exemplary embodiment, the semiconductor substrate further includes regions surrounding the deep trenches having a lateral doping concentration gradient with the concentration gradually decreasing from regions immediately next to sidewalls of the deep trenches. In another exemplary embodiment, each of the MOSFET transistor cells further having gate sidewall dopant regions surrounding sidewalls of the trench gate and a gate-bottom dopant region below the trench gate wherein the gate sidewall dopant regions and gate-bottom dopant regions are of a same conductivity type as the semiconductor substrate. In another exemplary embodiment, the drain contact dopant region surrounding a bottom portion of the deep trenches near a bottom surface of the semiconductor substrate for connecting to a drain electrode. In another exemplary embodiment, the semiconductor power device further includes a bottom metal layer constituting a drain electrode contact the drain contact dopant region. In another exemplary embodiment, the trench gates of the trench MOSFET cells and the deep trenches filled with the epitaxial layer therein further configured as stripes with the gate-shielding dopant regions disposed below stripes of the trench gates as floating dopant regions. In another exemplary embodiment, the trench gates of the trench MOSFET cells further configured as stripes with tabs extending toward the deep trenches filled with the epitaxial layer therein for electrically connecting the gate-shielding dopant regions under the extended trench gates to a body region of the transistor cells through the epitaxial layer disposed in the epitaxial trenches. In another exemplary embodiment, the trench gates of the MOSFET transistor cells further configured as stripes with offset tabs extending alternately on opposite sides of the trench gates toward the deep trenches filled with the epitaxial layer for electrically connecting the gate-shielding dopant regions under the extended trench gates to a body region of the transistor cells through the epitaxial layer disposed in the deep trenches.

This invention further discloses a method for forming a semiconductor power device on a semiconductor substrate. The method includes a step of a) providing a semiconductor substrate; b) opening a plurality of deep trenches in the semiconductor substrate and growing an epitaxial layer for filling the deep trenches and covers a top surface of the semiconductor substrate with a top epitaxial layer, wherein the portions of the epitaxial layer in the epitaxial deep trench and the top epitaxial layer are simultaneously grown as a single layer and wherein the epitaxial layer is of an opposite conductivity type as the semiconductor substrate; and c) forming a plurality of trench MOSFET cells in the top epitaxial layer by opening a plurality of trench gates and implanting a plurality of gate-shielding dopant regions below the gate trenches for shielding trench gates of the transistor cells during a voltage breakdown of the semiconductor power device and the top epitaxial layer acting as the body region and the semiconductor substrate acting as the drain region, whereby a super-junction effect is achieved through charge balance between the portions of the epitaxial layer in the deep trenches and the portions of the semiconductor substrate lateral to the deep trenches. In an exemplary embodiment, the method further includes a step of implanting through the sidewalls of the deep trenches with dopants of a first conductivity type to form a lateral concentration gradient in regions of the semiconductor substrate between the deep trenches and adjusting the device performance of the semiconductor power device by adjusting the deep trench sidewall implant. In another exemplary embodiment, the method further includes a step of controlling a thickness of the top epitaxial layer by adjusting a width of the deep trenches. In another exemplary embodiment, the method further includes a step of implanting the sidewalls and bottom of the gate trenches a dopant of a same conductivity type as the semiconductor substrate. In another exemplary embodiment, the step of providing a semiconductor substrate includes a step of providing a single layer semiconductor substrate and wherein the step of opening a plurality of deep trenches comprises a step of opening a plurality of deep trenches in the single layer semiconductor substrate. In another exemplary embodiment, the step of providing a semiconductor substrate comprising a step of providing a bottom substrate and growing a top substrate layer on top of the bottom substrate, wherein the top substrate layer is of a same conductivity type as the bottom substrate. In another exemplary embodiment, the method further includes a step of heavily doping the bottom of the deep trenches to form a drain contact region before the step of growing the epitaxial layer; and backgrinding the substrate to expose the drain contact region. In another exemplary embodiment, the method further includes a step of performing a partial CMP to a top surface of the epitaxial layer to smooth the top surface before the step of forming the plurality of trench MOSFET cells.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 2 to 8 are cross sectional views of high voltage power devices with super junction structure as different embodiments of this invention.

DETAILED DESCRIPTION OF THE METHOD

Figure 1A:
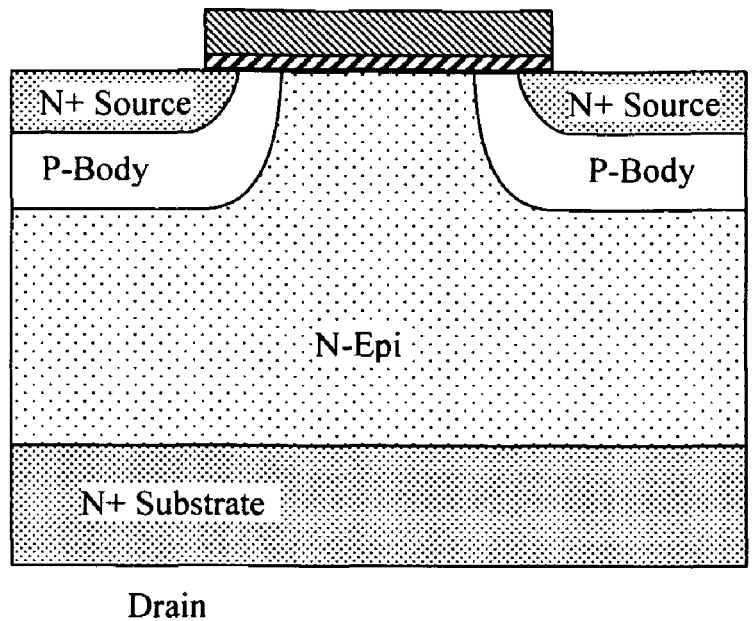
FIGS. 1A to 1B are cross sectional views for showing conventional vertical power device configurations manufactured by conventional methods.
Figure 1B:
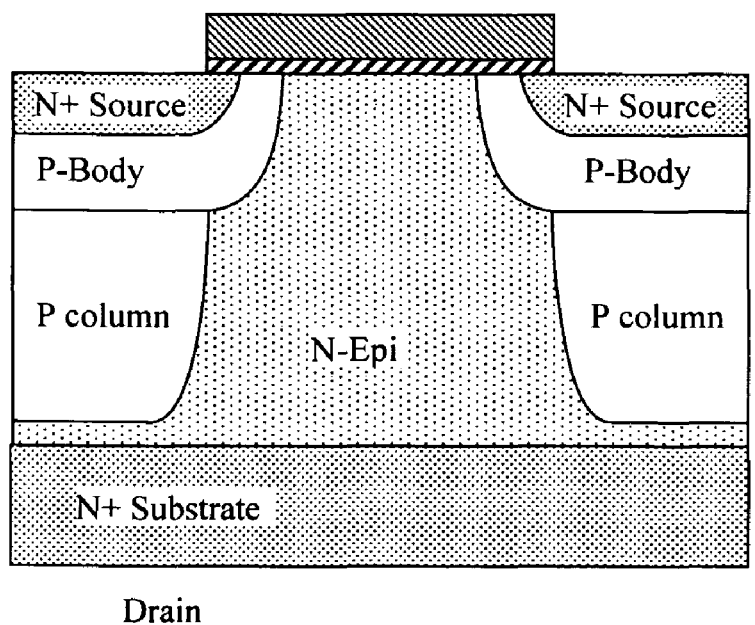
Figures 1, 1C:
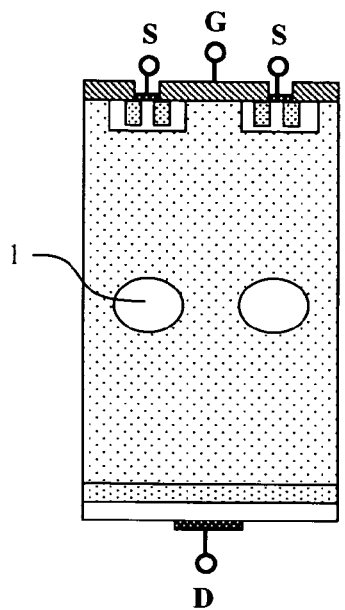
FIGS. 1C-1 to 1C-3 are cross sectional views for showing floating islands formed in the bulk of the epitaxial layer not aligning with the gate or gate trenches.
Figures 1, 1C, 2:
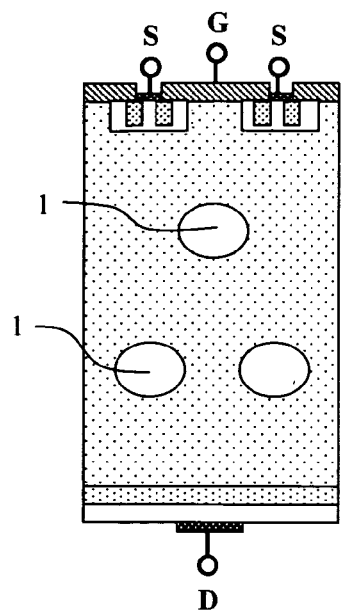
Figures 1, 1C, 2, 3:
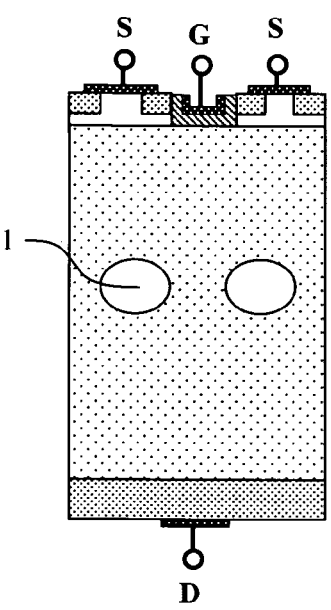
Figure 1D:
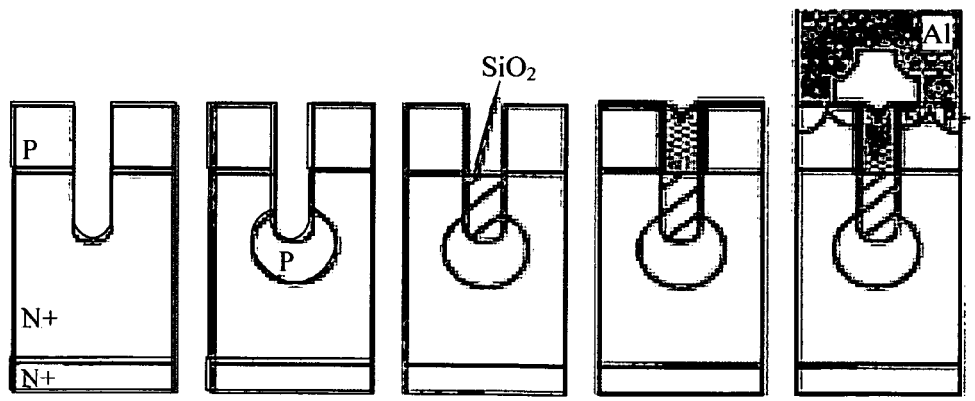
FIG. 1D is a cross sectional view for showing dopant regions below the gate trenches connected to the trenches.
Figure 2:
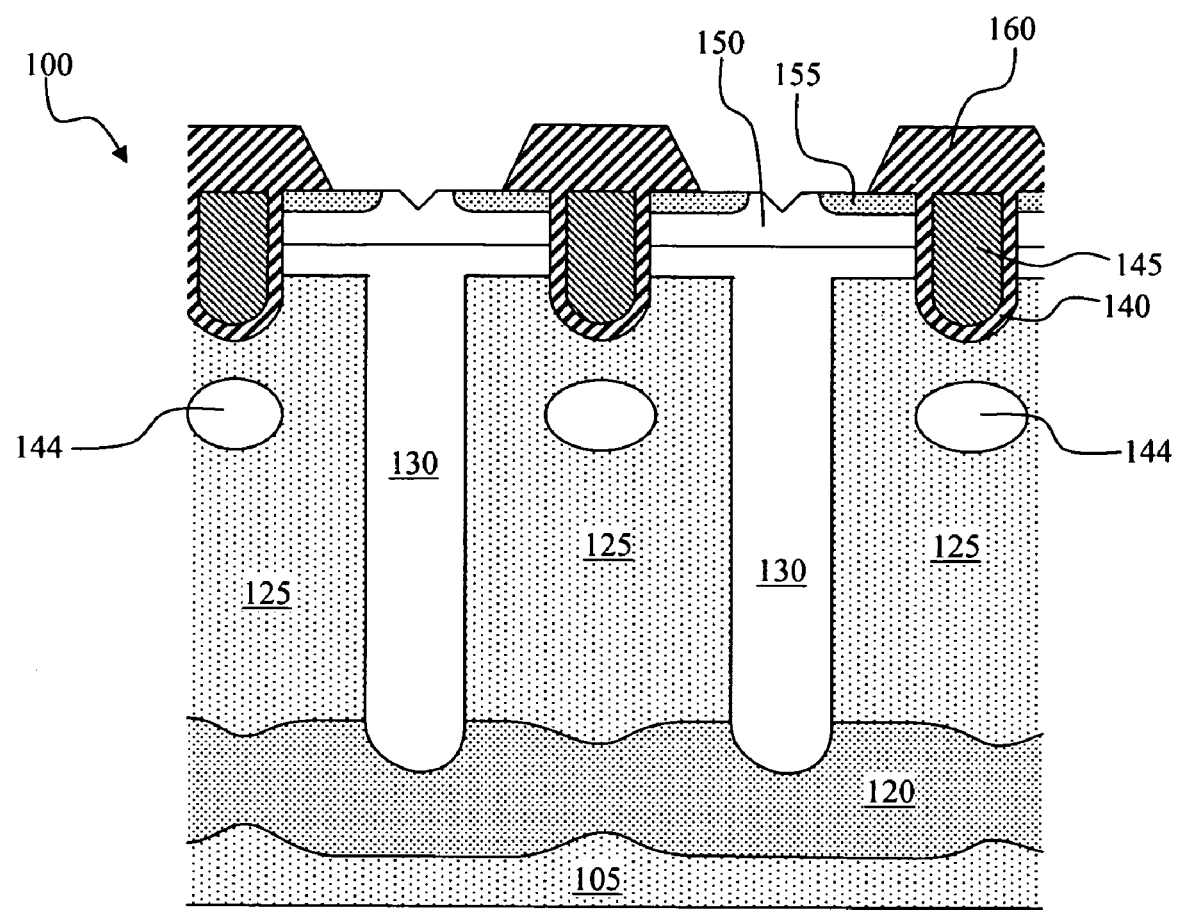
Figure 3:
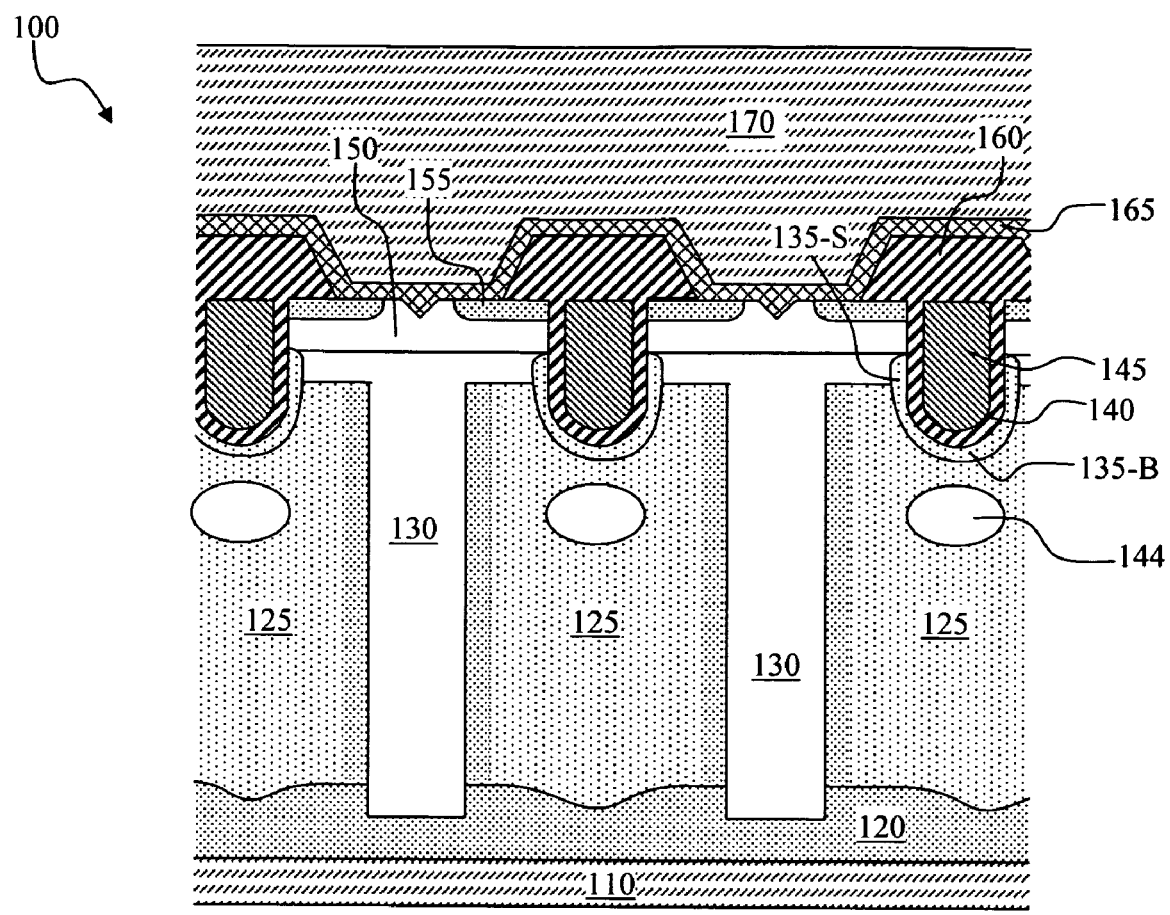

Referring to FIG. 2 for a cross sectional view of a MOSFET device 100 that illustrates the new concepts including the new structural and manufacturing features of this invention. The details of the MOSFET device 100 will be further described and explained in FIG. 3 below. The MOSFET device 100 is supported on a substrate 105 that includes an N+ doped bottom region 120 functioning as drain contact region doped through deep trenches 130 (after back-grinding, as shown in FIG. 3 below) that is filled with an epitaxial layer therein. The substrate 105 may include a top portion 125 in which the deep trenches 130 are formed. For the example of an n-channel MOSFET, the substrate 105 is n-type, and the epitaxial layer in the deep trenches 130 is p-type. The MOSFET transistor cells are supported on the single thin epitaxial layer filling in epitaxial column trenches 130 and covering over the top surface surrounding the P-epitaxial columns that has the P-epitaxial filling in the column trenches. The thin P-epitaxial layer portion over the top also serves as the body regions surrounding the trench gate 145 filled with gate polysilicon therein. The P-body regions 150 further encompass the source regions 155 surrounding the trench gates 145. The trench gates 145 are padded with a gate oxide layer 140, filled with polysilicon and covered with an insulation layer 160 with contact openings to allow a source contact metal to contact the source-body regions between the trench gates 145. The trench gates 145 are further shielded with gate-shielding dopant regions 144 implanted through the gate trenches before the trenches are filled with the gate polysilicon. The gate-shielding dopant regions 144 are therefore self-aligned with the trench gates 145. The gate-shielding region 144 have the same conductivity type as the epitaxial layer filling in epitaxial column trenches 130.

The device as shown in FIG. 2 provides a single thin epitaxial layer to form the trench gates with gate polysilicon filled in the trenches opened therethrough. The new configuration achieves super-junction performance, i.e., performance below the "Johnson Limit", with breakdown voltage independent of the thickness of the epitaxial layer grown on the starting substrate. It is the depth of the trench into the semiconductor substrate as well as the charge balance of the epitaxial column trenches with the substrate regions therein-between, which set the breakdown voltage. The thickness of the epitaxial silicon growth is only a function of the width of the deep trenches which are etched in the silicon substrate. Conventional devices do not have this flexibility and must grow epitaxial layers as drift regions which have a thickness proportional to the desired breakdown voltage.

The structure shown is flexibly scalable and the device can be manufactured by applying simple manufacturing technologies. For example, a device capable of achieving a low specific resistance below the Johnson Limit, over a wide range of breakdown voltage (200V to 900V for example) can be realized by using a single epitaxial silicon layer growth of a few microns, and a single trench etch with a depth proportional to the desired breakdown voltage (about 10-15 micron for >200V, about 40-50 micron for >600V and about 70-90 micron for >900V). Furthermore, the transistor portion of the device supported on the top portion of the epitaxial layer 130 is structured as trench-gate DMOS device wherein the device configuration is self-aligned and can be conveniently and easily manufactured. The sensitive trench gate 145 portion of the device is formed away from seams which may form above the deep trenches 130, which improves the reliability of the device. This feature can also avoid the use of an additional CMP step.

Referring to FIG. 3 for a cross sectional view of a MOSFET device 100 with the new concepts and basic structures illustrated in FIG. 2 and manufactured according the processes described in FIGS. 13A to 13N below. The MOSFET device 100 is supported on an N type substrate includes an N+ doped bottom region 120 functioning as drain contact region immediately above and in contact with a bottom drain electrode 110. The drain contact regions 120 are doped through deep trenches containing epitaxial layer 130. Each of these deep trenches is filled with a P-epitaxial layer filling the trenches and covering the top surfaces surrounding and above the trenches. The MOSFET transistor cells are supported on the single thin P-epitaxial layer that fills in epitaxial column trenches 130 and covering over the top surface surrounding the P-epitaxial columns. The thin P-epitaxial layer over the top is formed with P-body regions 150 surrounding the trench gates 145 with gate polysilicon filling in the trenches opened through the top epitaxial layer 130. The P-body regions further encompass the source regions 155 surrounding the trench gates 145. The trench gates 145 are padded with a gate oxide layer 140 and covered with an insulation layer 160 with contact openings to allow a source contact metal 170 over a metal barrier layer 165 to contact the source-body regions between the trench gates 145. The trench gates 145 are further shielded with p-type gate-shielding dopant regions 144 implanted through the gate trenches into the N-substrate regions 125 before the gate trenches are filled with the gate polysilicon. The gate-shielding dopant regions 144 protect the sensitive gates 145 during a voltage breakdown of the MOSFET device. The N substrate regions 125 surrounding the P-epitaxial columns 130 may be implanted with N-dopant through the deep trench 130 sidewalls for achieving to create a lateral doping concentration gradient for achieving an N-column charge control.

The Super-Junction effect, or charge balance, is achieved by ensuring that the electrical charges of the P-epitaxial layer filled in the trenches is laterally balanced, i.e., balanced along the distance that is perpendicular to the drain current flow in the n-type drift region 125 of the vertical MOSFET structure, so that they deplete when the MOSFET is in the off state. In other words, the electrical charges of the P-epitaxial layer filled in the trenches is substantially equal to the electrical charges of the N-drift region adjacent to the N-substrate within the manufacturing tolerances. The electrical charges in the N-drift region can be controlled and adjusted by controlling either the doping of the N-substrate, or the doping of the N-substrate plus any additional N-dopant ions which may be implanted in the sidewalls of the deep trenches. For ideal operation, the P=N=1E12 atoms per square centimeter is the target charge. The more flexible the control of the electrical charges in the manufacturing processing by controlling the implant dosages, implant annealing, substrate doping concentration, epitaxial dopant concentration, trench depth, width and shape, and the parameters of other processing steps, the more the structure of the device can be optimized and fine tuned to achieve a lower specific resistance for a given breakdown voltage.

The MOSFET transistor cells further include N type dopant implant regions 135-S along the gate sidewalls and N type dopant implant regions 135-B below the gate trench bottom. The sidewall and bottom dopant implant regions surrounding the gates 145 may be applied to eliminate the sensitivity of the channel of the MOSFET device relative to the trench depth and the P-epitaxial dopant concentrations. This embodiment with the new structure is based on the consideration of forming a high-performance MOSFET structure inside the P-epitaxial layer. The epitaxial layer is grown with minimal or no etch-back of the P-epitaxial layer at all. For a MOSFET to function, it must have a source of the same conductivity as the drain, and a body which has an opposite conductivity, as well as an accumulation region which connects the channel to the drain. When a trench-gate vertical MOSFET structure is realized, the source is at the top with the channel formed in a body region below the source and along the sidewalls of the gate trenches. An accumulation region must be formed between the body region and the drain. For a high-voltage structure with the new configuration as disclosed in this invention, it would be difficult to form a high-performance vertical trench-gate MOSFET when the P-epitaxial grown on the top horizontal surfaces of the N-substrate is very thick. With a thick P-epitaxial layer, the gate trenches would have to be deep in order to reach through to the N-drift drain region. A deep trench, combined with a thick P-body region, will result in a low-performance vertical DMOS structure because of the resulting long channel and high channel resistance. Therefore, in the embodiments of this new invention which deal with P-epitaxial layers which may have a greater thickness between one to three urn relative to the typical depth of gate trenches generally in a range between 0.8 to 1.5 um, additional dopant implants in the gate trench sidewalls and bottom are carried out. The additional dopant implants are to compensate the P-epitaxial region in the accumulation and drain regions in proximity to the gate trenches, in order to realize high performance vertical trench-DMOS devices, with shortened channel lengths. Therefore, the addition of the tilted and non-tilted implants in the gate trench prior to the fabrication of the MOSFET device is the gate trenches enables high-performance trench-gate MOSFET devices independent of the P-epitaxial layer thickness and dopant concentrations in these regions. An n-type dopant implant 135-B at the bottom of the gate trench may also serve to ensure that the gate shielding regions 144 do not contact the gate trenches 145.

It should be noted that the embodiment of FIG. 3 shows a gate trench which reaches through the P-epitaxial layer, and therefore, the additional N-type implants 135-S, 135-B, may be selected to optimize the performance of the MOSFET without the need to compensate completely the P-doped region, i.e., the P-epitaxial layer, on the gate trench sidewalls. Implant species can be preferably phosphorus as well as Arsenic or Antimony. Energy can be in the 50 KeV to 200 KeV range. Tilt angle should be zero for the bottom implant, and +/−5 to 15 degrees for the sidewall implants. Dose can be in the 1E11 to 1E13 range. An additional p-type body implant may be performed to form body region 150 and ensure that a channel region remains along the trench gate 145 sidewalls.

Figure 4:
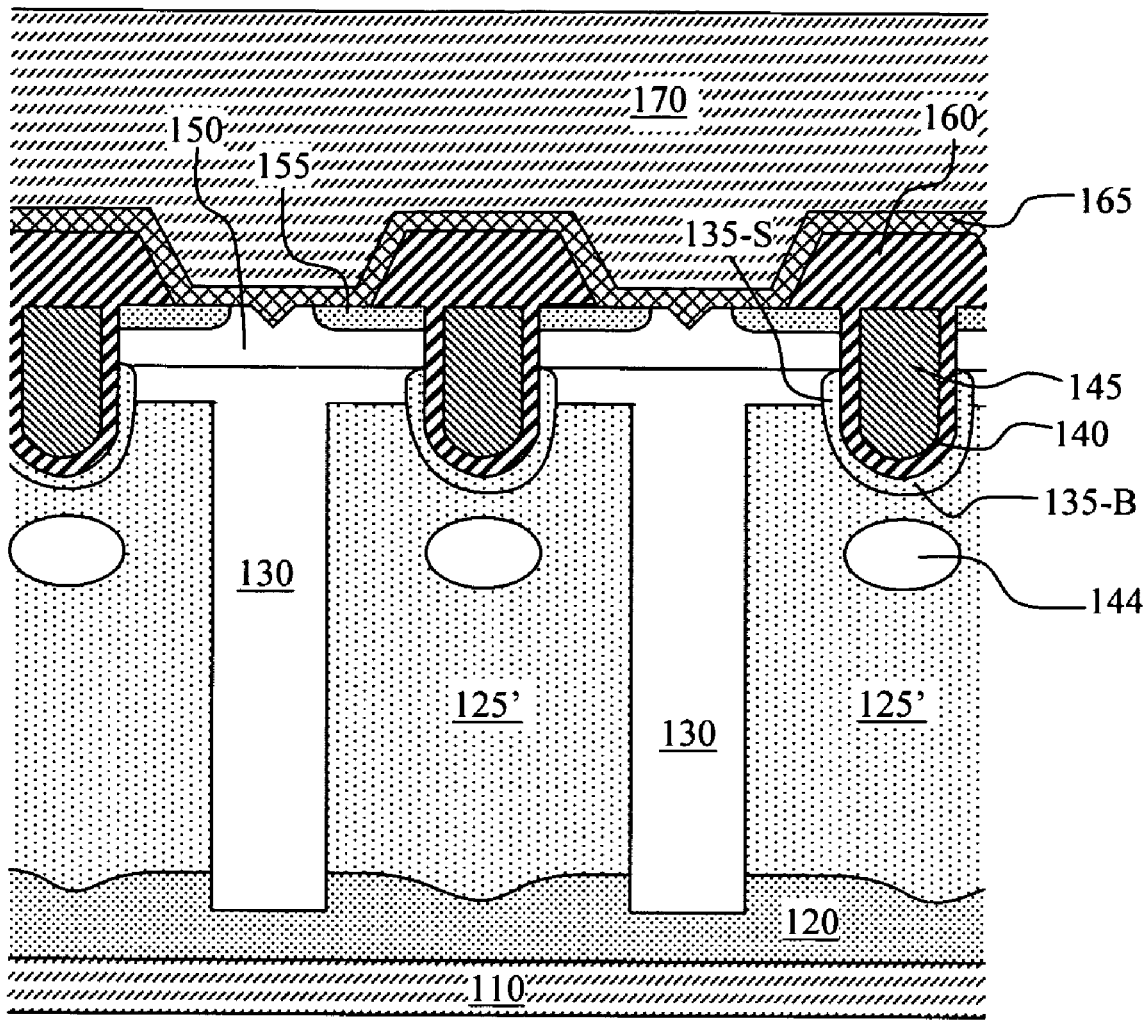

FIG. 4 is a cross sectional view to show an alternate embodiment of a MOSFET device similar to that shown in FIG. 3 except that the sidewalls of N-substrate regions 125' are not implanted with N dopant to achieve the charge control function through the manufacturing processes. This embodiment does not require the additional N-dopant regions for incorporation in the sidewalls of the deep trenches, because it is assumed that the doping concentration of the starting N− substrate is adequate to ensure charge balance with the grown P type epitaxial layer in the deep trenches. The doping concentration of the starting N− substrate is adequate when the actual value of the doping concentration can achieve the necessary charge balance, i.e., achieving the goal of having approximately absolute value of the N charge=P charge=1E12 atoms/cm^2. A dopant implant to carry out the charge control is not necessary when the substrate concentration can achieve the charge balance goals within the desired tolerance limits. (for example, when the occurrences of the N-substrate having adequate dopant concentration is better than +/−10% repeatability in the manufacturing processes).

Figure 5:
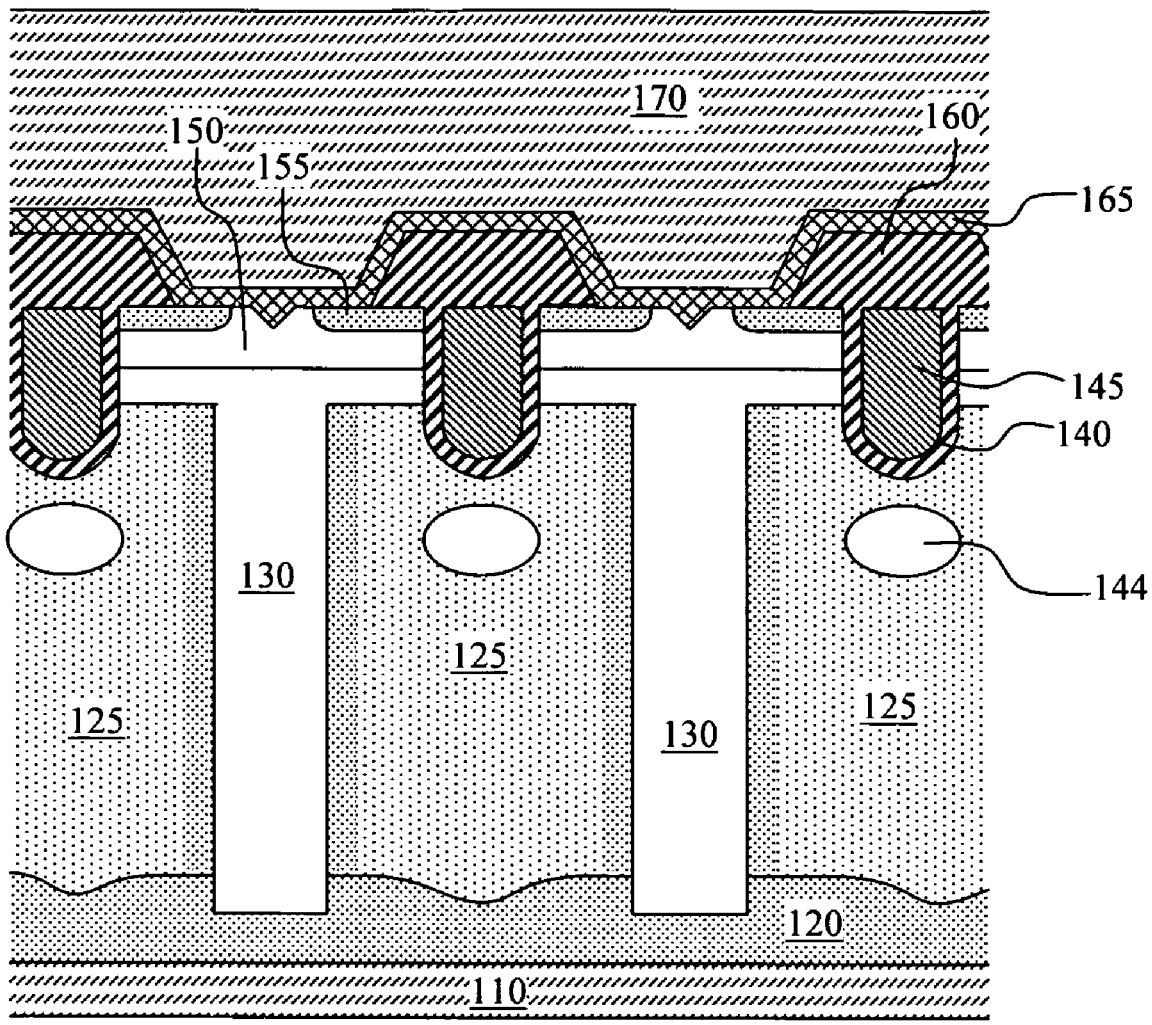

FIG. 5 is a cross sectional view to show an alternate embodiment of a MOSFET device similar to that shown in FIG. 3 except that the MOSFET device does not include a sidewall and trench bottom dopant implant regions 135-B and 135-S shown in FIG. 3. When the trench gates 145 have a greater depth and extend below the epitaxial layer 130 into the substrate region 125, the requirement for applying the trench sidewall and trench bottom dopant implant regions to eliminate the channel sensitivity to the depth of the trench gates are no longer necessary.

Figure 6:
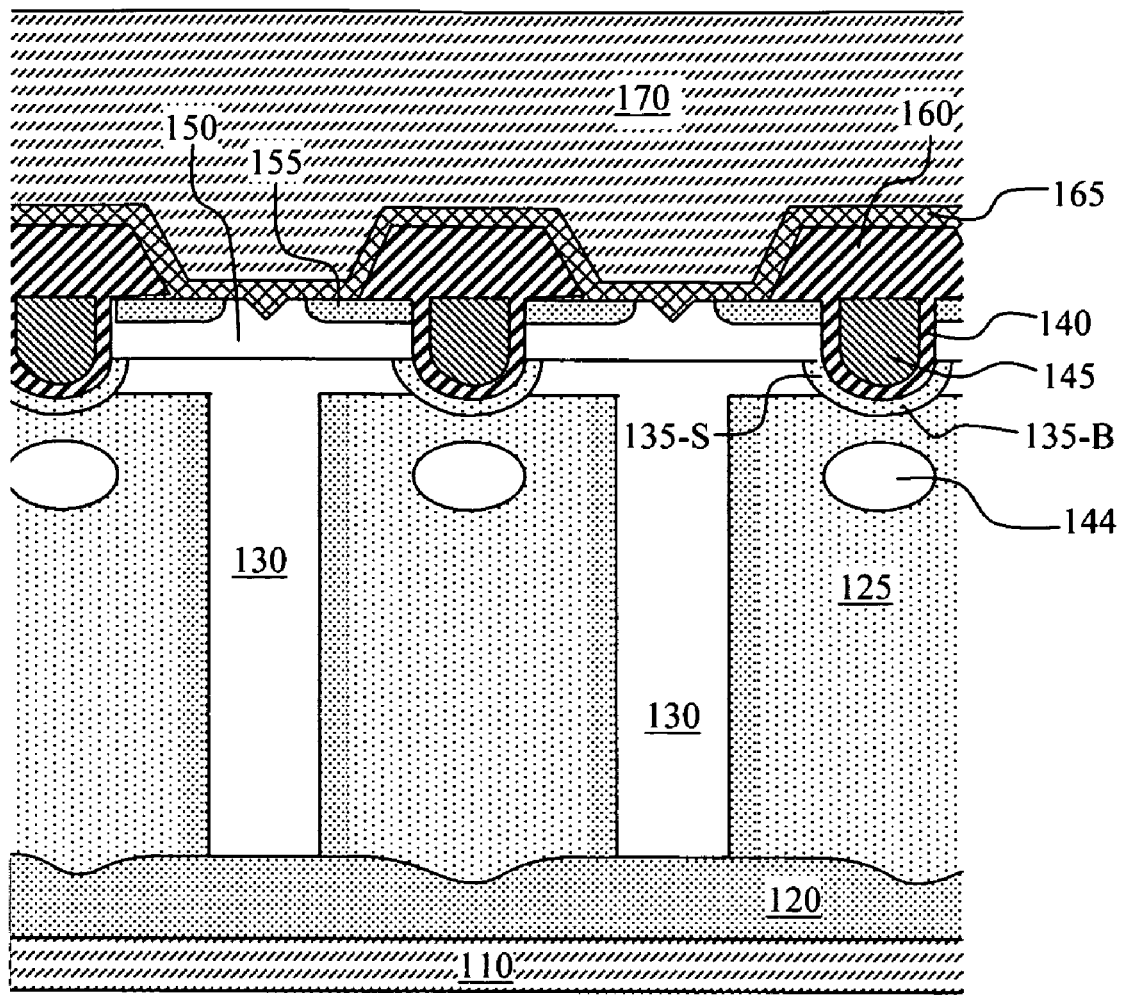

FIG. 6 is a cross sectional view to show an alternate embodiment of a MOSFET device similar to that shown in FIG. 3 except that the MOSFET device has shallower trench gates with a depth shallower than the epitaxial layer. The MOSFET device includes a gate trench sidewall and gate trench bottom dopant implant regions 135-S and 135-B, respectively, to compensate the P-epitaxial layer 130 and to ensure that there are appropriate accumulation and channel regions. This embodiment is based on a configuration that the MOSFET device has thick P-epitaxial layers, or shallow gate trenches, or a combination of both. The gate trenches do not reach to the N drain region. In order to ensure proper and efficient transistor operations, the lower portion of the gate trenches must be doped as an N dopant region 135-B to ensure that there will be an accumulation region to connect the drain to the active channel formed in the body region along the sidewalls of the gate trenches.

Figure 7:
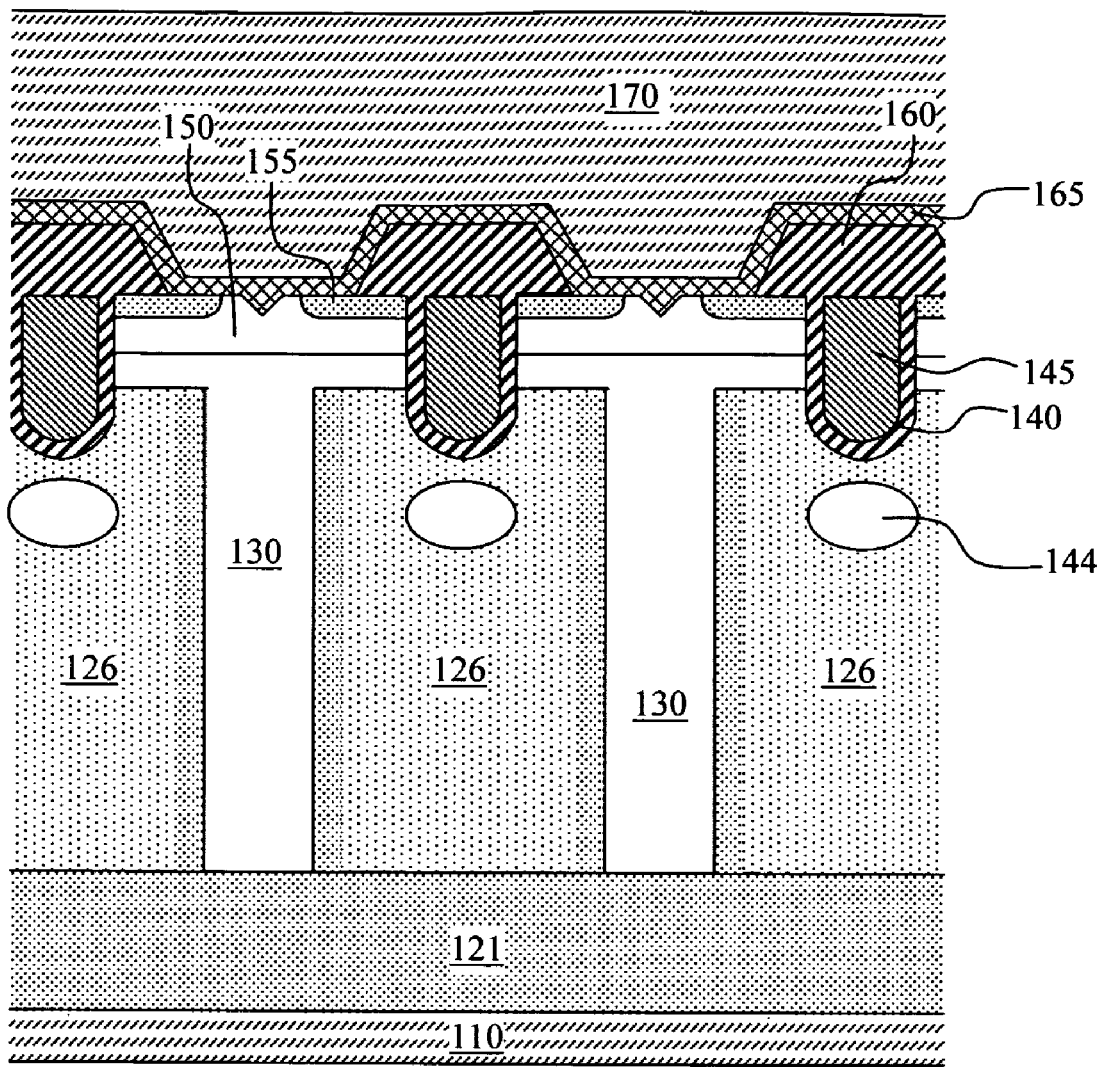

Conventional wafers have a heavily doped substrate, with lightly doped layer on top. However, the devices in FIGS. 2-6 were made from a plain wafer that did not initially have an epi-layer. This can save a considerable amount of the wafer costs, but requires extra steps of doping the bottom through the deep trench and back grinding the wafer. Alternatively, the device in FIGS. 7-8 uses a conventional wafer with a heavily doped N+ bottom substrate 121, and a less heavily doped N-type top substrate layer 126 grown over the N+ bottom substrate 121. In a conventional wafer, this N-type top substrate layer 126 is known as an epitaxial layer, however to avoid confusion, it is referred to in this application as a top substrate layer. FIG. 7 is a cross sectional view to show an alternate embodiment of a MOSFET device similar to that shown in FIG. 3 except that the deep trenches 130 filled with P-epitaxial layer is now located in the top substrate layer 126 and extended to touch the highly doped bottom substrate region 121. A separate drain contact region 120 of FIG. 3 formed by a separate dopant implant process is no longer required. Instead, a highly doped N+ bottom substrate region 121 with an N-type top substrate layer 126 grown on top of it is used as the drain contact for this embodiment. The top substrate region may be thin compared to those of conventional wafers, thus saving cost. A backside grinding might not be required for this embodiment. A metal drain electrode 110 may be formed beneath the highly doped bottom substrate region 121.

The drain contact dopant implant process at the bottom of the deep trenches is eliminated, so the manufacturing processes are therefore significantly simplified.

Figure 8:
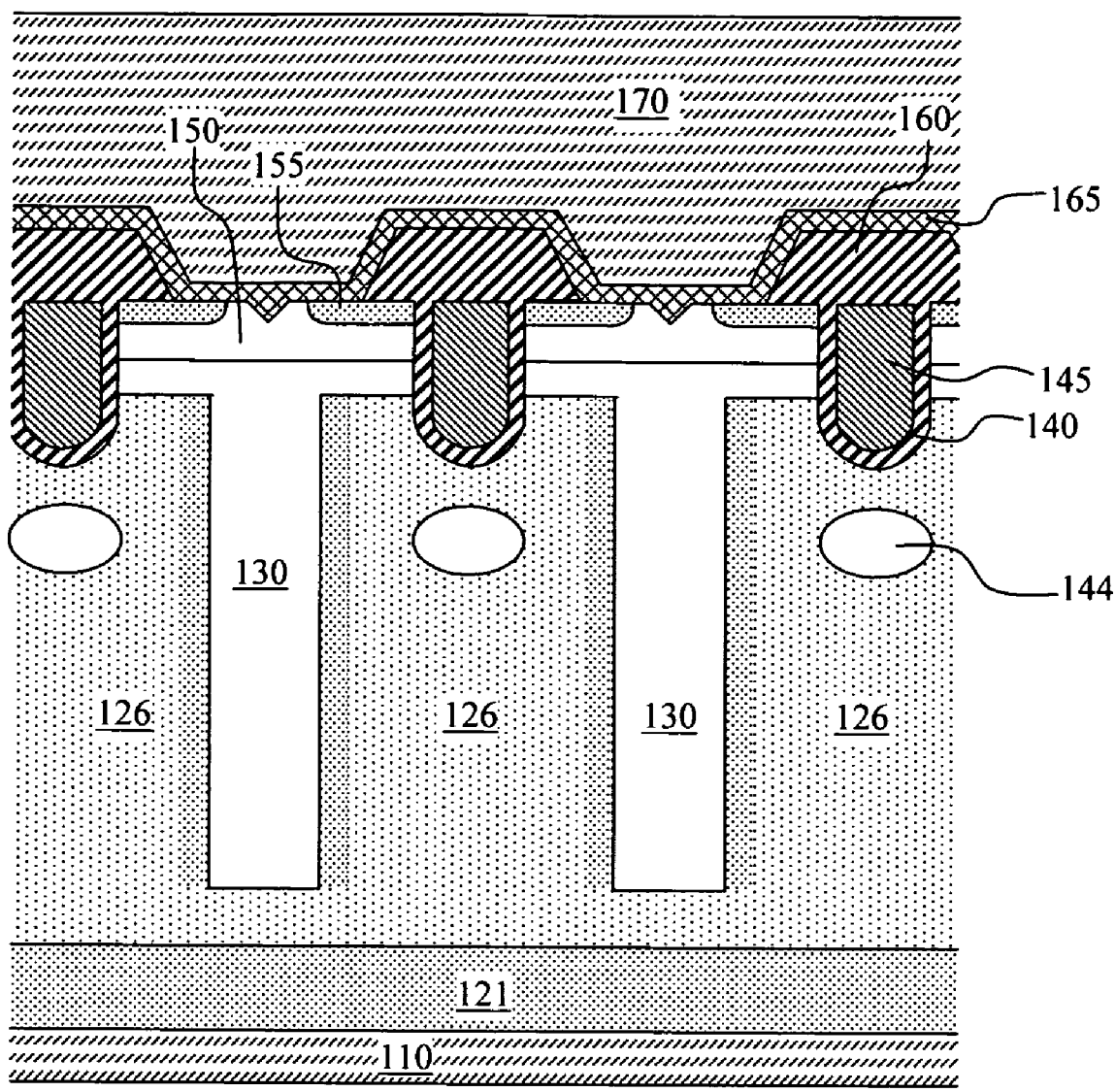

FIG. 8 is a cross sectional view to show an alternate embodiment of a MOSFET device similar to that shown in FIG. 7 except that the deep trenches 130 filled with P-epitaxial layer is now at a depth that is shallower than the N+ bottom substrate 121.

Figure 9:
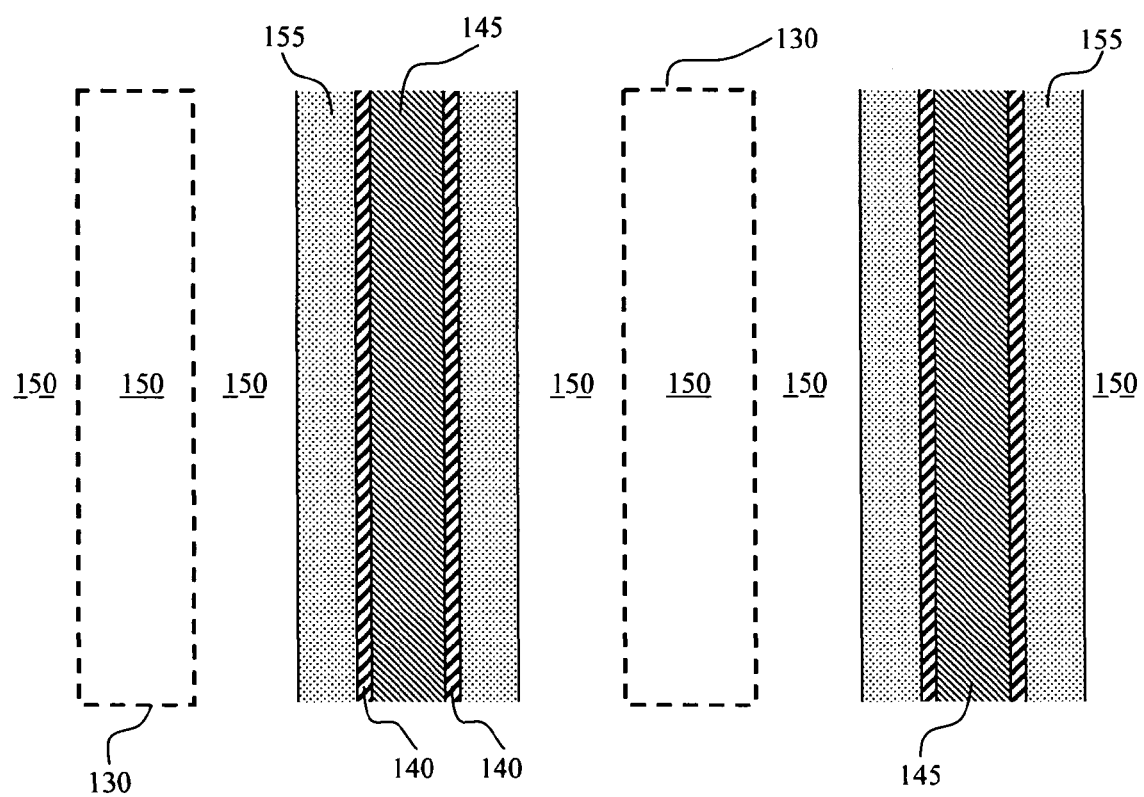
FIGS. 9 to 12 are top views for illustrating different layout configurations for arranging the trench-shielding dopant regions.

FIG. 9 is a top view for showing a stripe layout of the semiconductor power device of this invention. The epitaxial deep trenches grown with the epitaxial layer 130 are formed with stripe configuration The outline of the epitaxial deep trenches 130 are shown in dashed lines. The transistor cells including the trench gates 145 padded with the gate oxide layer 140 surrounded by the source regions 155 encompassed in the body regions 150 are also formed with a linear stripe layout. The self-aligned gate-shielding dopant regions (not specifically shown here) are also formed as floating stripe below the trench gates 145.

Figure 10:
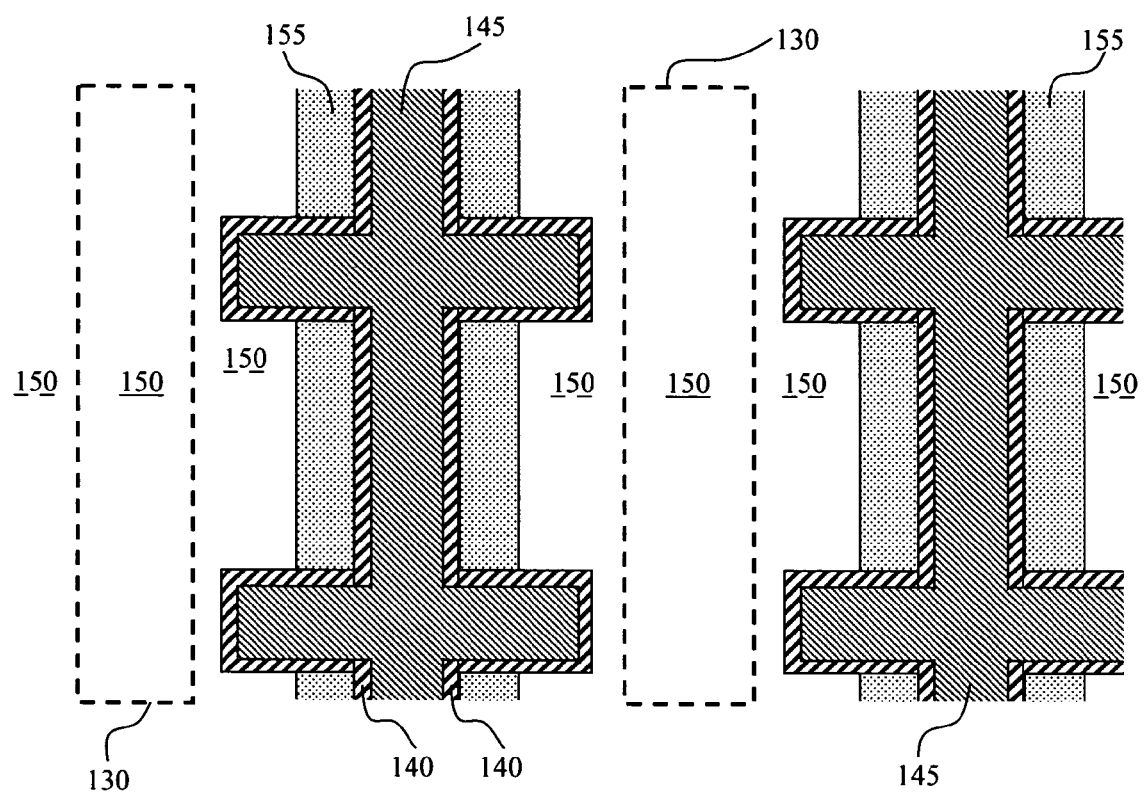
Figure 11:
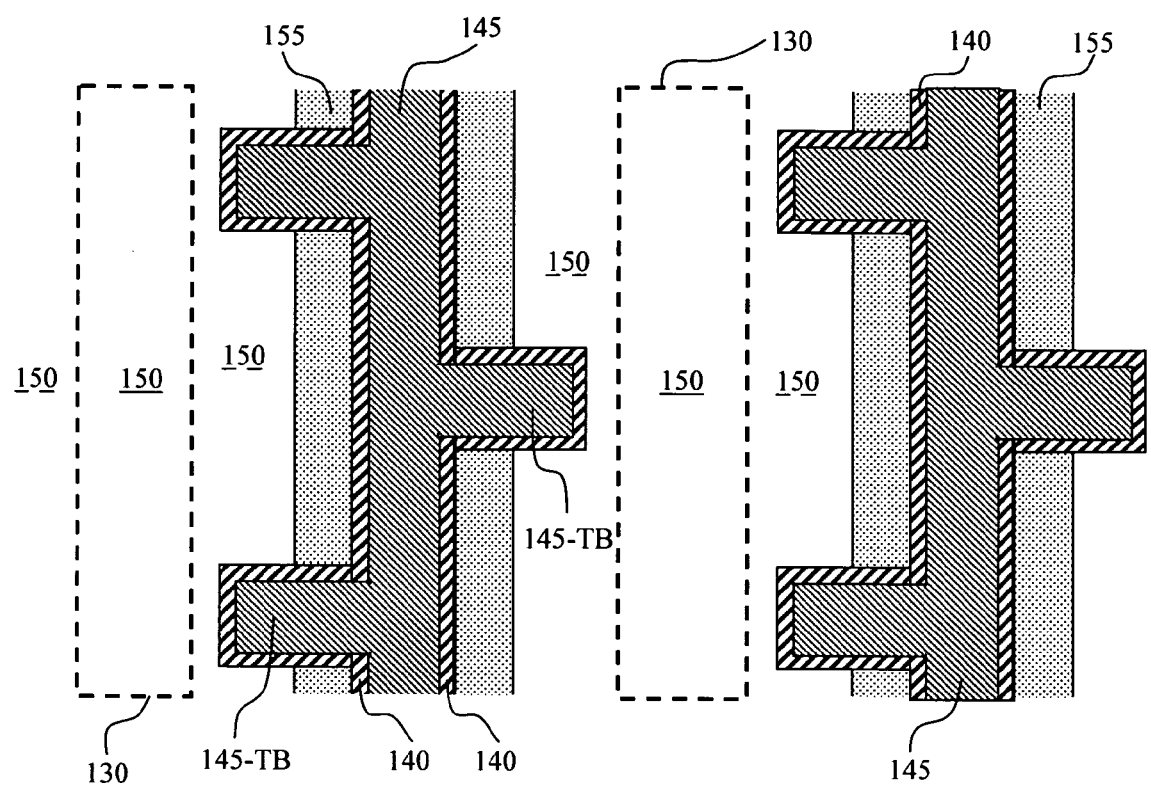
Figure 12:
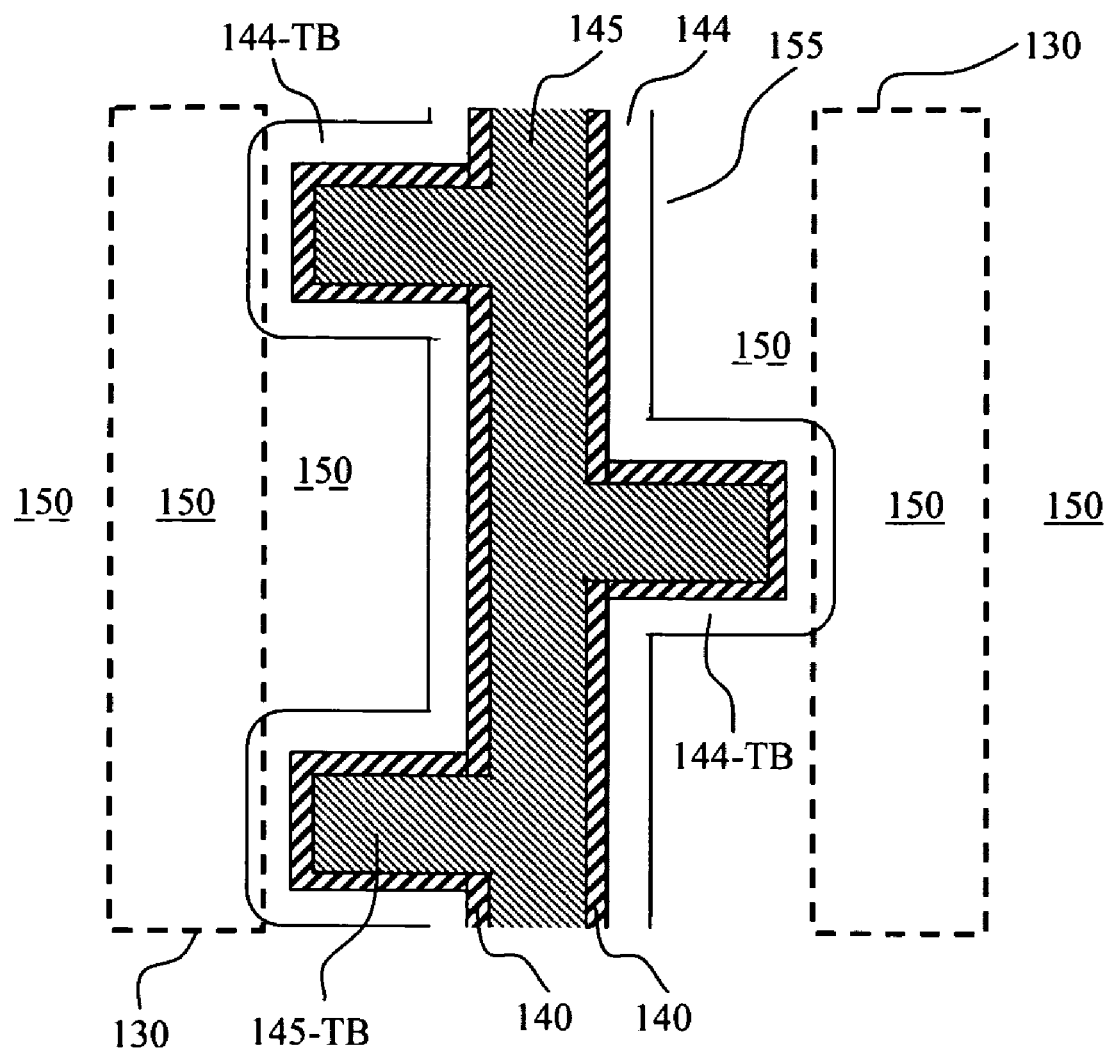

FIG. 10 shows an alternate embodiment with a different transistor cell layout. Instead of manufacturing the gate-shielding dopant regions 144 below the trench gate 145 as floating regions, the gate shielding-p-dopant regions 144 may be connected to the P-dopant epitaxial columns 130 below the body regions 150 by extending the trench gate 145 as cross shape trench gates to the P-columns 130 regions in some parts of the transistor cells as shown in FIG. 10. FIG. 11 shows a similar embodiment with the exception that the extended trench gates 145 have offset tabs 145-TB to reduce the drain-source on resistance Rdson, and to make improve the manufacturability of the device. (cross-shaped gate trenches may have voiding issues when filled). FIG. 12 shows the same layout as FIG. 11, but illustrates how the gate-shielding dopant region tabs 144-TB self aligned under the gate trenches 145, and are diffused out to contact the p-doped columns 150. The gate-shielding dopant regions 144 are implanted under the main gate stripe 145 and under the gate tabs 145-TB perpendicular to the main gate stripe. The p-shield dopant regions 144 electrically contact the p-body 150 regions through the connection regions intersecting between the gate-shielding dopant region tabs 144-TB and the p-epitaxial columns 130. The offset layout has reduced impact to the channel width. The offset tabs may also achieve better distributed current flows by allowing current flow on the other side of the trench gate tabs 145-TB.

Figure 13A:
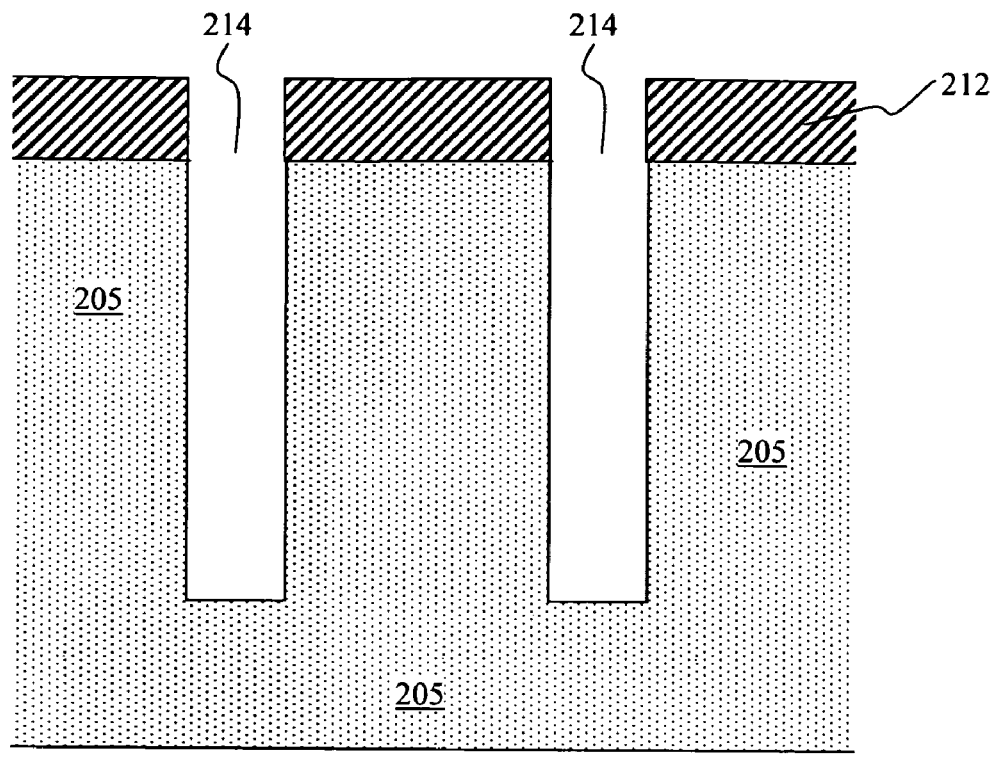
FIGS. 13A to 13N are a cross sectional views to illustrate processing steps of this invention to manufacture high voltage power device similar to FIG. 3 with super junction structures and self aligned trench-shielding dopant regions.
Figure 13B:
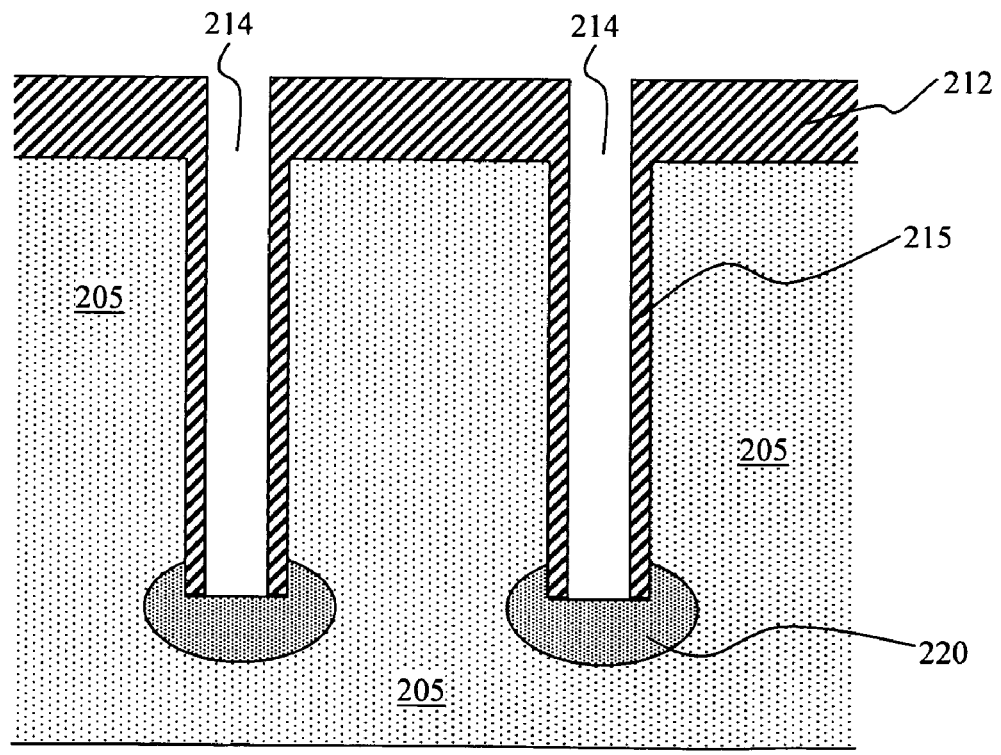
Figure 13C:
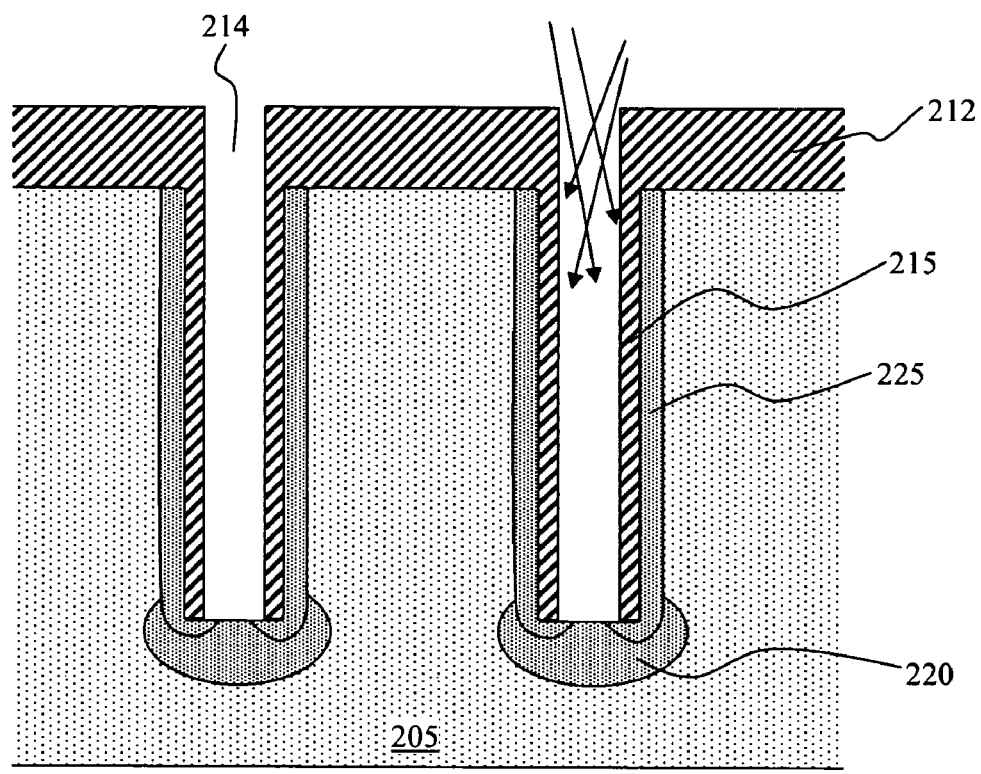
Figure 13D:
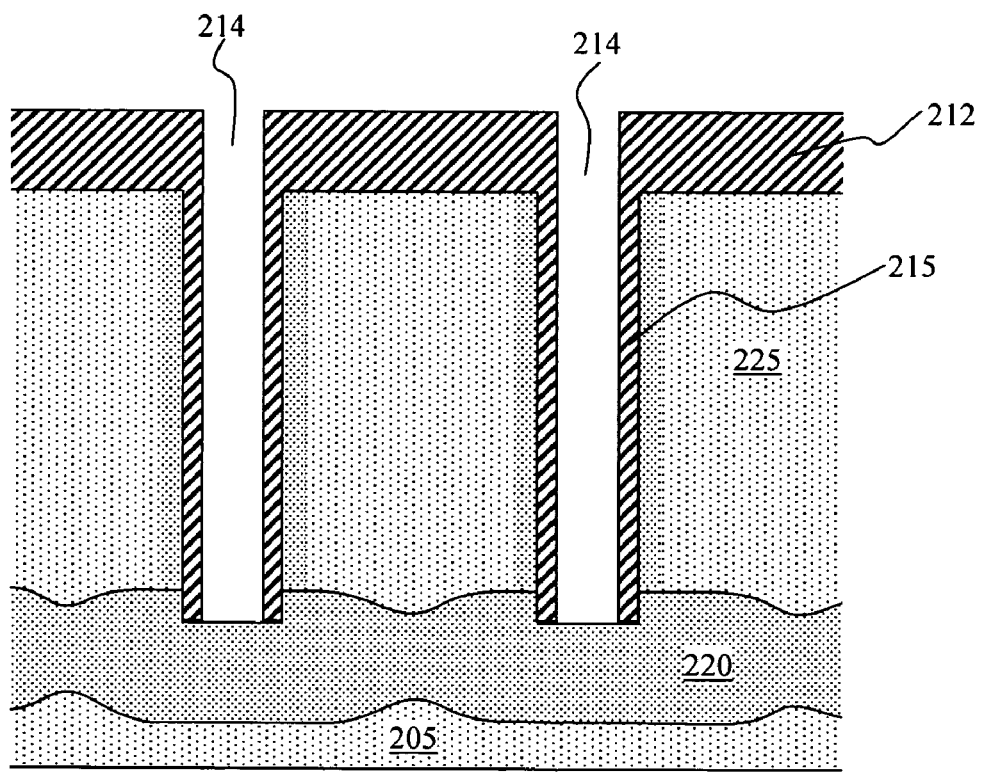
Figure 13E:
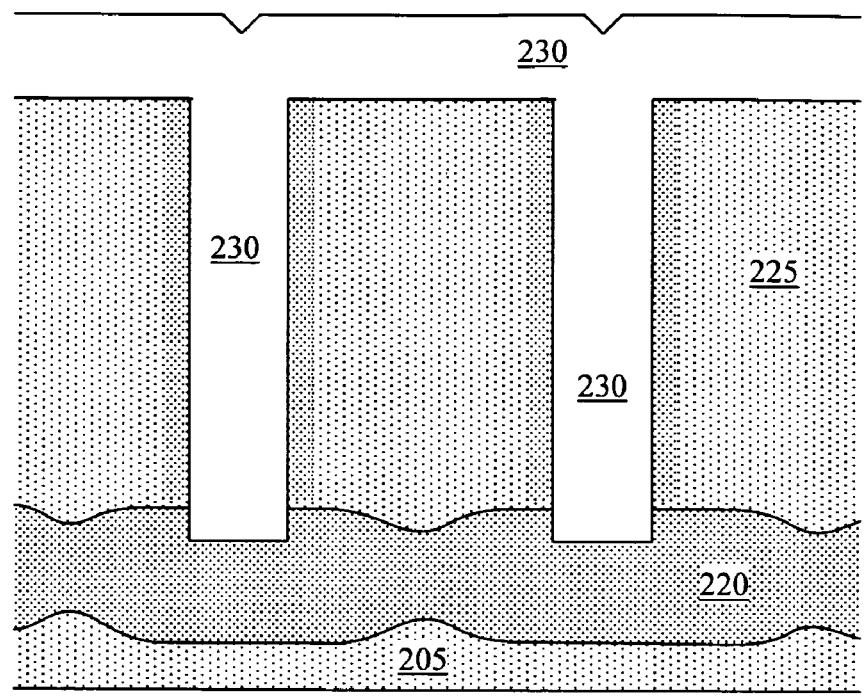
Figure 13F:
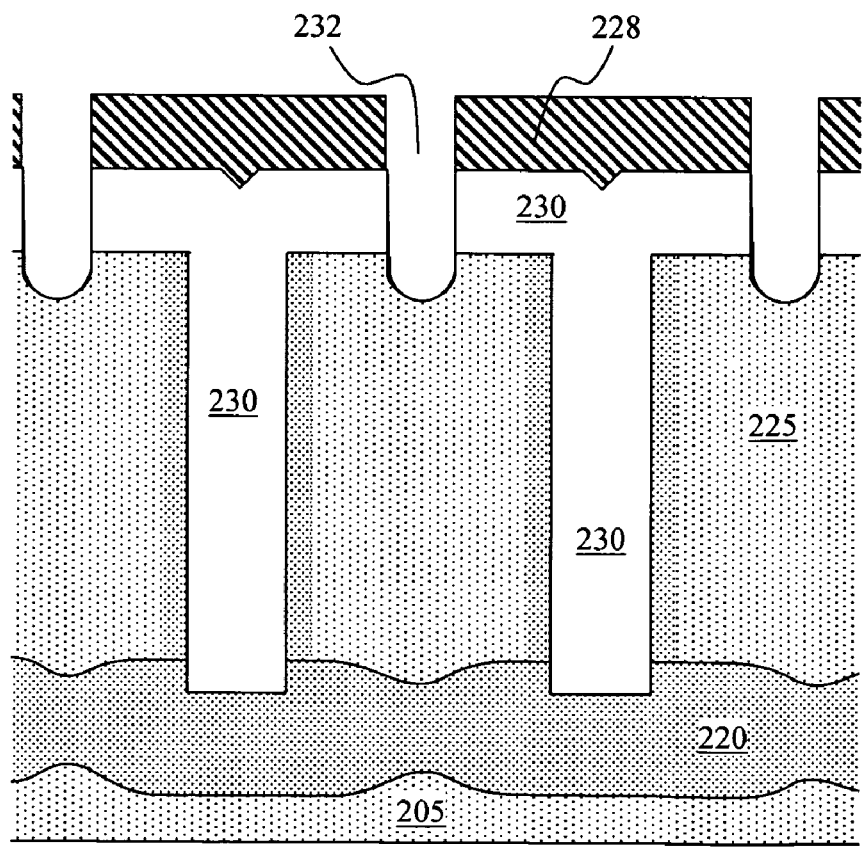
Figure 13G:
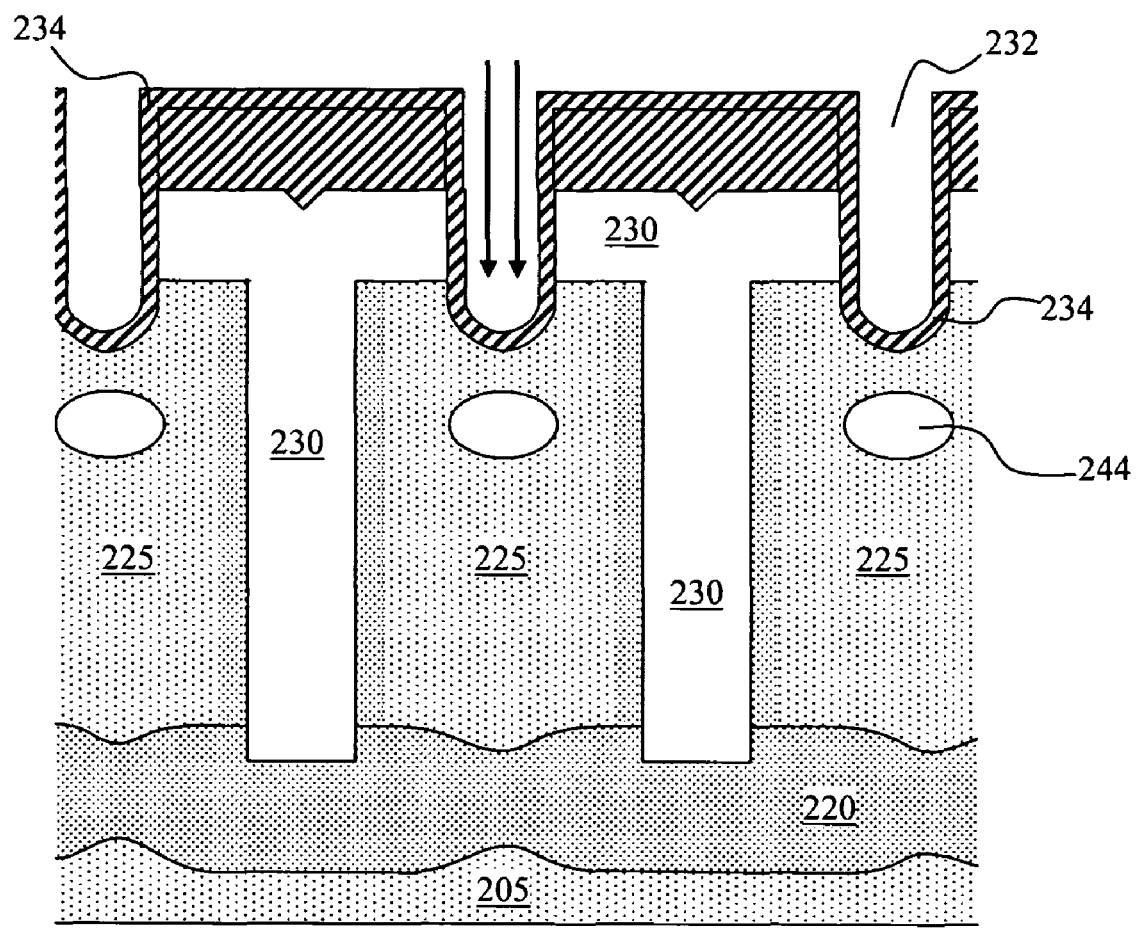
Figure 13H:
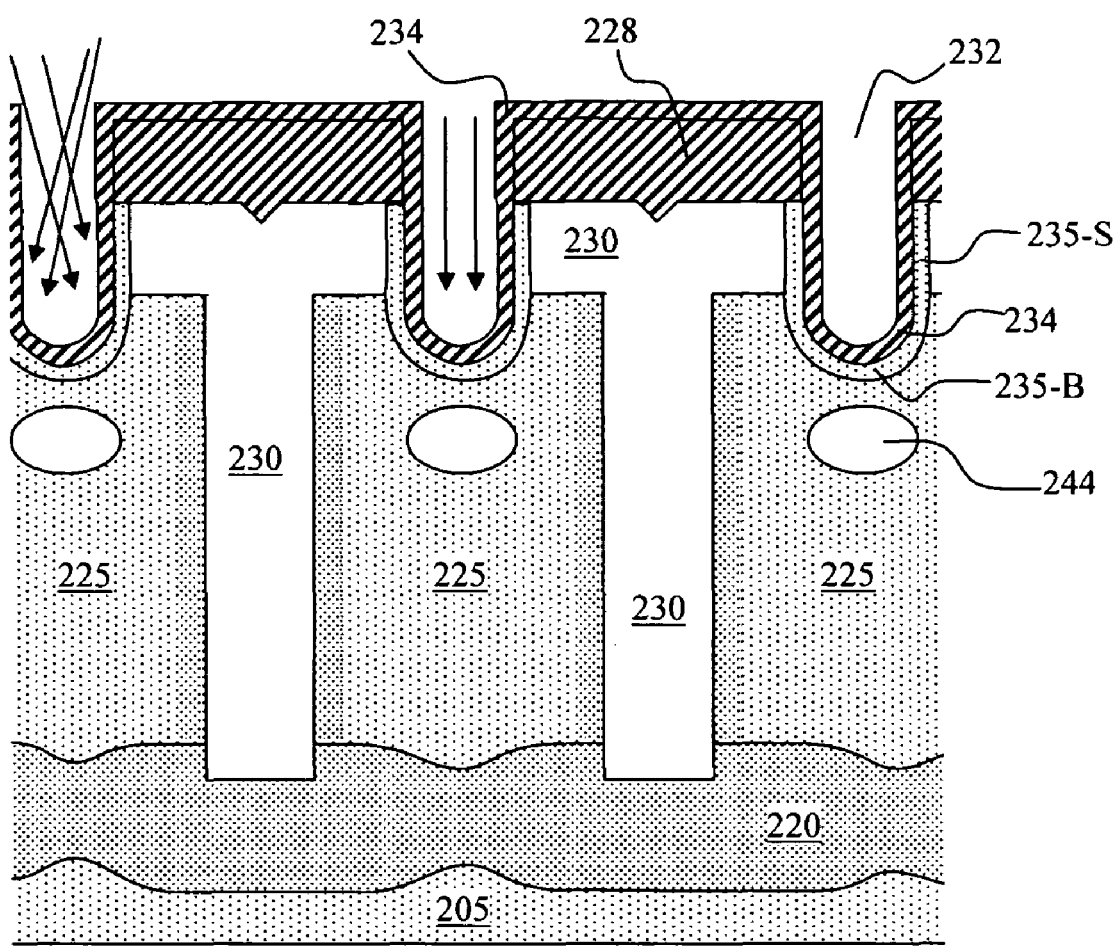
Figure 13I:
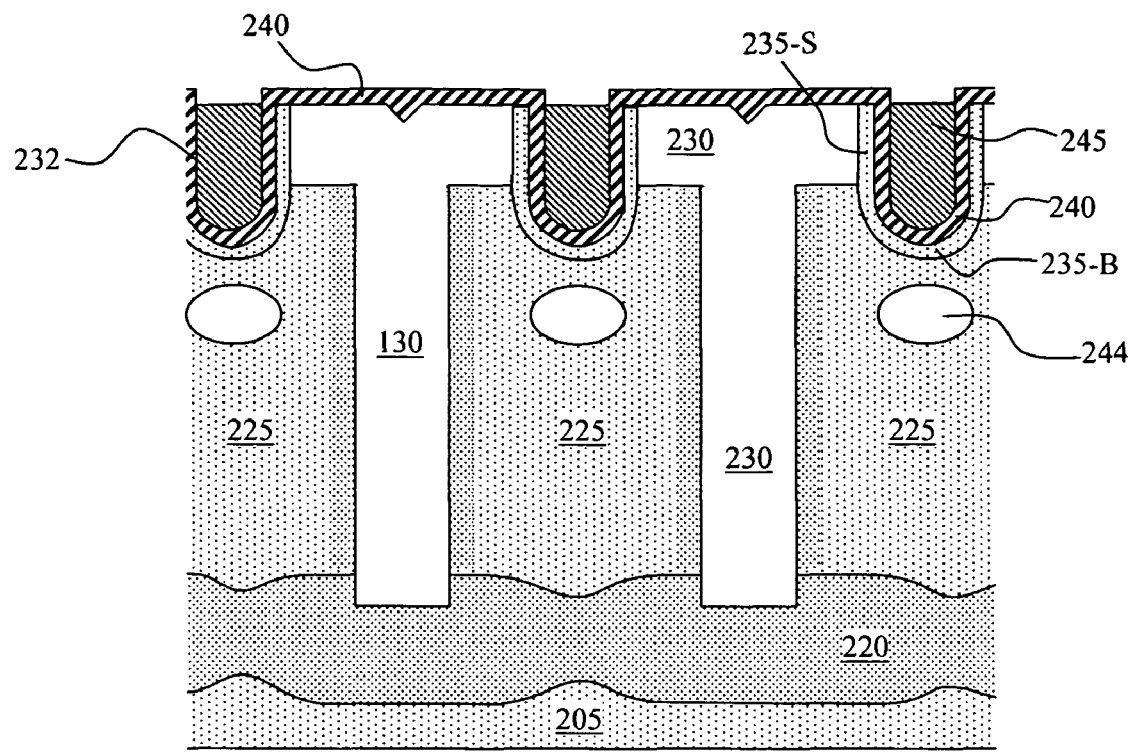
Figure 13J:
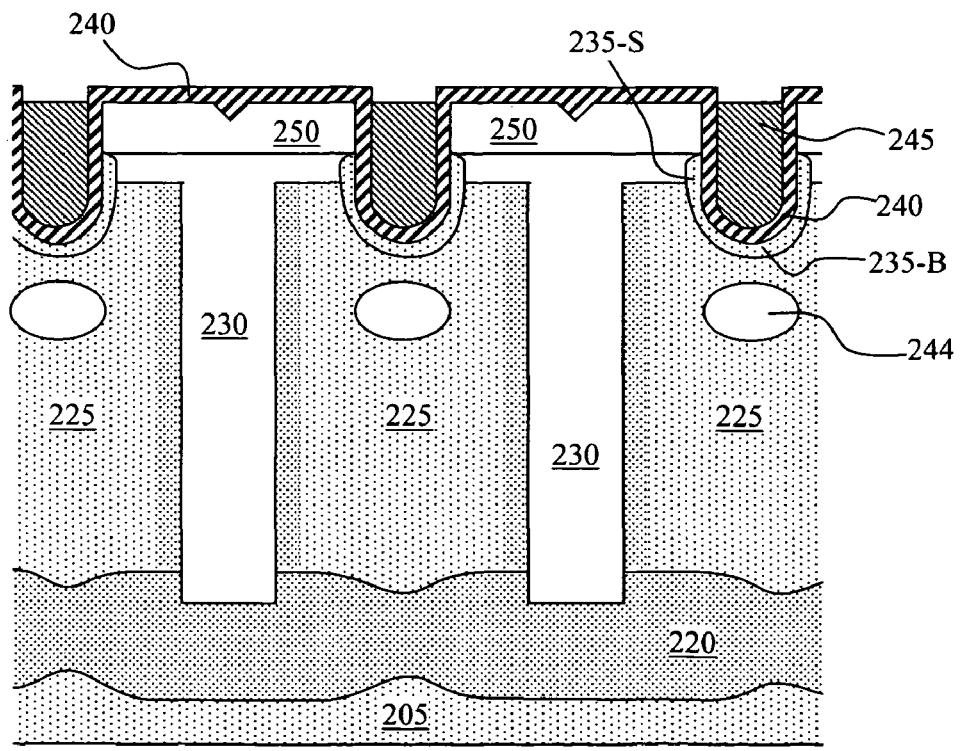
Figure 13K:
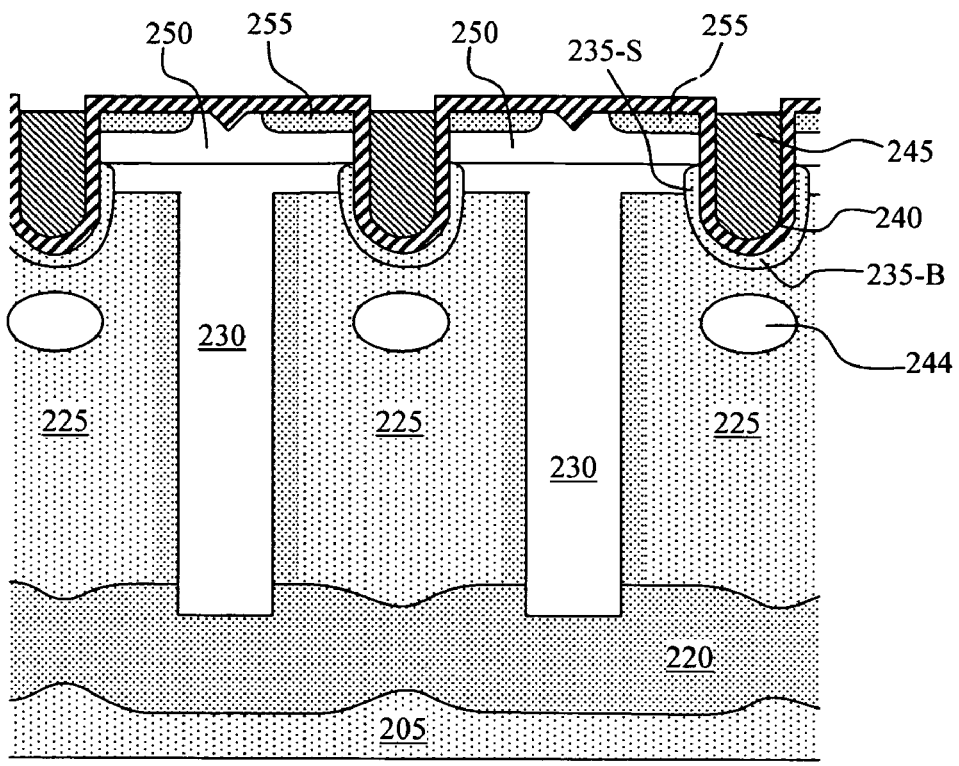
Figure 13L:
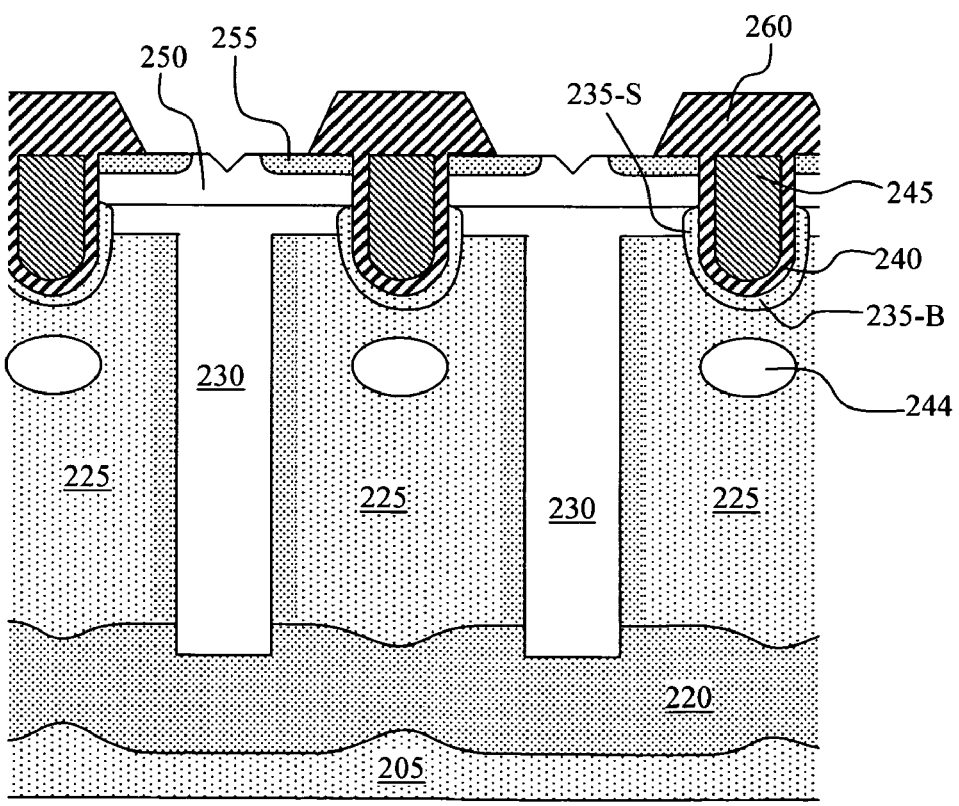
Figure 13M:
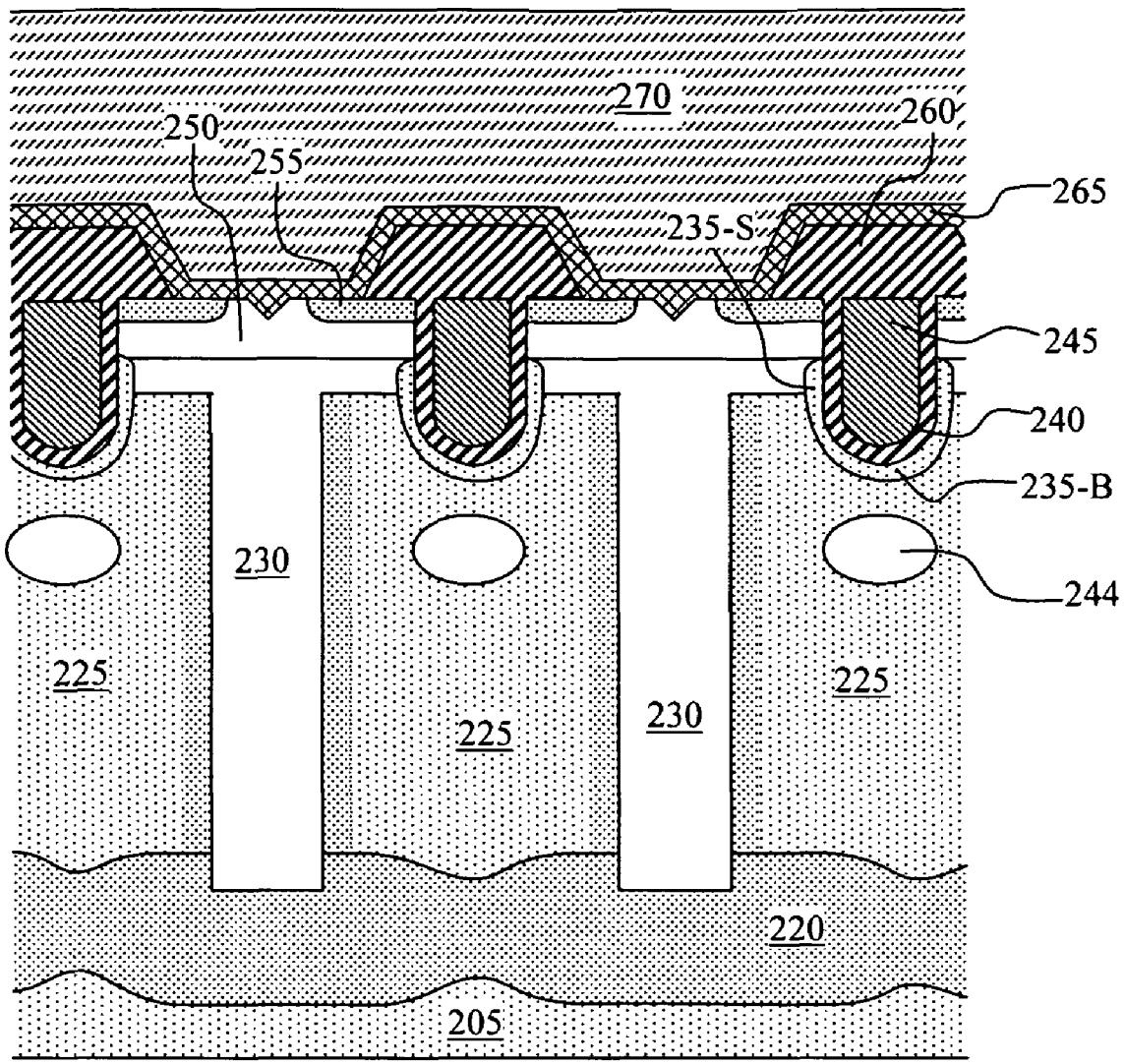
Figure 13N:
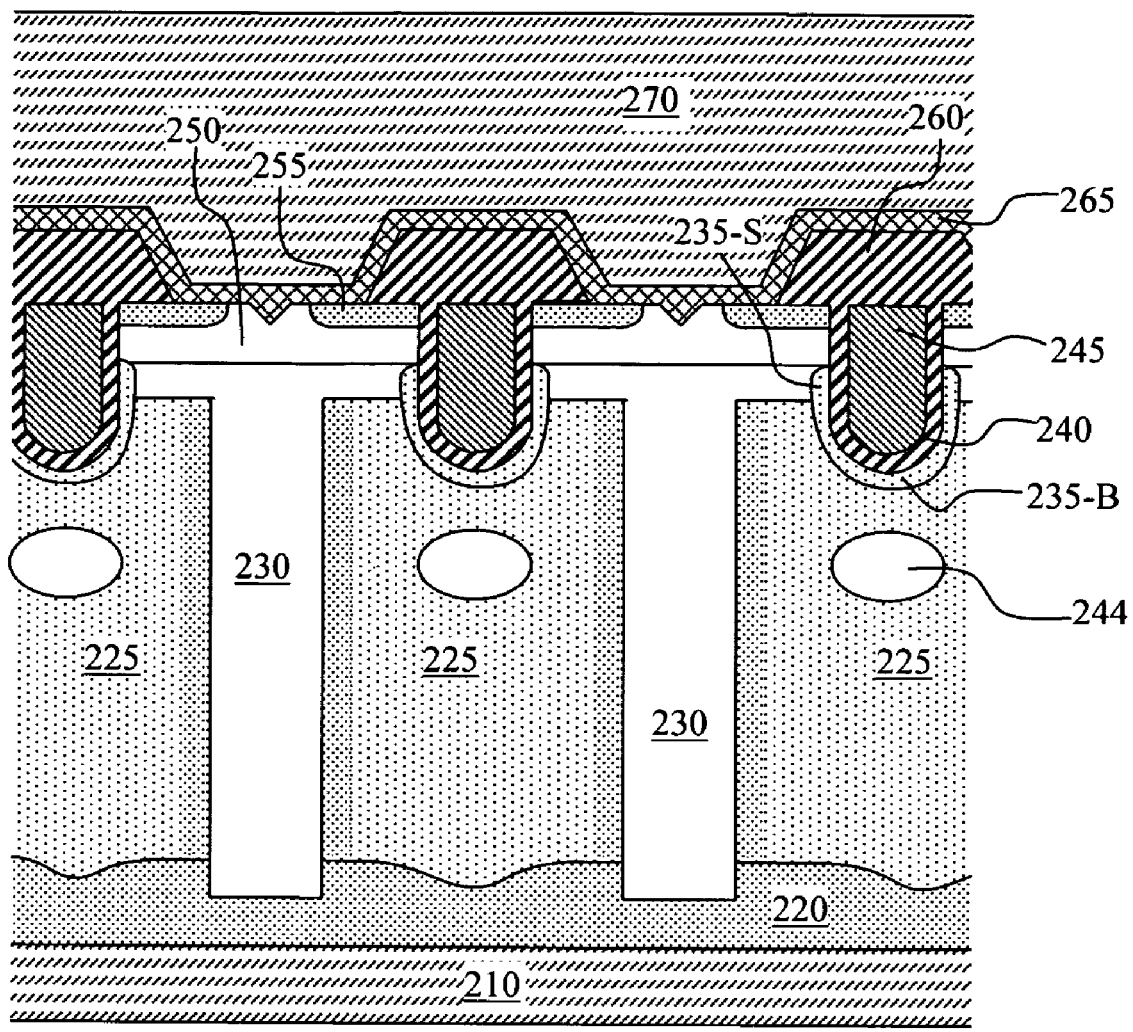

Referring to FIGS. 13A to 13N for a serial of side cross sectional views to illustrate the fabrication steps of a charge balanced semiconductor power device as that shown in FIG. 3. FIG. 13A shows a starting silicon substrate includes an N substrate 205 having a resistivity approximately 10 ohm/cm. The N substrate 205 initially has no epitaxial layer. A hard mask oxide layer 212 is deposited or thermally grown with a thickness of 0.1 to 1.5 micrometer. Then a trench mask (not shown) with a critical dimension (CD) in a 1 to 5 microns range, is applied to carry out an oxide etch to open a plurality of trench etching windows followed by removal of the photoresist. A silicon etch is carried out to open deep trenches 214 with a depth of 40 to 50 microns for devices operated at a voltage of about 650 volts. Depending on the type of etcher and etch chemistries, photoresist only mask may also be used to pattern and open the trench as well instead of using the hard mask oxide layer 212 as shown. The trench opening may be in the 1 micron to 5 microns range preferably 3 microns for most applications (the trench opening being defined by the trench mask mentioned earlier). Then a wafer clean process is performed. In FIG. 13B, a conformal oxide layer 215 is formed by either an oxide deposition or thermal growth process. Then an optional RIE anisotropic etch is carried out to clear the oxide from the bottom of the trench bottom surface if the oxide layer is thicker on the bottom surface. The thickness of the oxide layer 215 is between 0.015 to 0.1 micron when the process does not include the optional RIE step, and the layer thickness of the oxide layer 215 is between 0.1 to 0.4 micrometers when the processes include the optional RIE step. A drain contact implant is performed by implanting N+ ions along a zero tilt angle relative to the sidewalls of the trenches, i.e., a vertical implant, having an implant dosage greater than 1E15 to form the drain contact regions 220 immediately below the deep trenches 214. The drain contact region 220 may be implanted with N-type ions such as phosphorus or arsenic ions. The oxide layer 215 along the sidewalls protects the sidewalls from the high dosage of the drain contact implant.

In FIG. 13C, a trench sidewall implant is carried out with N-type ions such as phosphorous ions to set the doping concentration in the N regions. An implant with tilted angle and rotated operations are performed with a dosage of 5E11 to 2E13 and a tilt angle of five to fifteen degrees are carried out to form the N-regions 225 between the trenches depending on the trench depth. In FIG. 13D, a high temperature anneal operation at 1050 to 1200 degrees Celsius for 30 to 60 minutes with low oxygen (O2) and/or N2 is applied to diffuse the N+ drain contact region 220 and also to laterally diffuse the sidewall implant N-regions 225. The N-regions 225 now form a lateral N-type concentration gradient, with the concentration being greatest near the deep trench side walls. The sidewall implants may be used to adjust the N-type concentration of the regions of the substrate 205 that are along a lateral direction relative to the deep trenches in order to achieve a charge balance (for super-junction effect) with the P-epitaxial layer 230 (about to be grown). Alternatively to the sidewall implants, the substrate 205 can be initially formed with the required N-type concentration to achieve the super-junction effect. In FIG. 13E, the oxide layers 212 and 215 are etched off and a P-epitaxial layer 230 with a P dopant concentration of 1E15 to 1E16 or higher, is grown (depending on the desired breakdown voltage). The thickness of the P-epitaxial layer 230 is sufficient to fill the trenches 214. For a trench 214 with a width of about 3 microns, the thickness of the epitaxial layer 230 is approximately 1.5 to 2.0 microns over the top of N-region 225. In FIG. 13F, an oxide layer is deposited with a thickness of about 0.5 to 1.5 microns as hard-mask layer 228 followed by applying a gate trench mask (not shown) to etch the hard-mask oxide layer 228 then removing the photoresist. The width of the gate trench may be of the order of 0.4 to 1.5 micron typically. A silicon etch is carried out to etch the trench gate openings 232 through the P-epitaxial layer 230 with a trench depth of about 1 to 2.5 microns that may penetrate through the P-epitaxial layer 230 into the N-dopant regions 225 between the epitaxial columns 230 deposited into the trenches 212. The process is then followed with wafer cleaning and optionally a round hole etch to smooth the gate trench profile followed by another wafer cleaning process.

In FIG. 13G, the oxide hard mask 228 is removed followed by depositing a thin screen layer 234 covering the sidewalls and the bottom surface of the gate trenches 232. A deep P-type implant with boron (B11) ions with an energy between 200 to 600 KeV and a dose between 1E12 to 1E13 is carried out with zero tilt angle to form the gate-shielding P-dopant regions 244 below the gate trenches 232 in the N-doped columns 225. In FIG. 13H, an optional n-type gate trench sidewall-implant with a tilt angle between +/−5 to 7 degrees implanting angle is carried out optionally to compensate the P-epitaxial layer 230 followed by a n-type gate trench bottom implant with zero tilt angle to compensate the P-epitaxial layer 230 if the gate trench 232 is too shallow, or to ensure that the gate-shielding P-dopant regions 244 do not contact the gate trenches 232. The implants into the gate trench sidewalls and the bottom surface to form the sidewall and bottom dopant regions 235-S and 235-B respectively eliminate the sensitivity of the channel of the MOSFET device relative to the depth of the trench gates and the doping concentration/thickness of the P-epitaxial layer 230. In FIG. 13I, the screen oxide layer 234 is removed and a gate oxide layer 240 is grown having a thickness of 0.01 to 0.1 micron depending on the device voltage rating. A gate polysilicon layer 245 is deposited into the gate trenches 232. The gate polysilicon layer 245 is preferably performed with in-situ N+ doping; the polysilicon layer 245 is doped by ion implantation or diffusion, if the polysilicon layer 245 is not in-situ doped. The gate polysilicon layer 245 is etched back from the top surface surrounding the trenched gates 245.

In FIG. 13J, an optional body mask (not shown) is applied to carry out a body implant with boron for a NMOS device having a dosage ranging from 3E12 to 1E14 followed by a body drive process at a temperature of 1000 to 1150 degree Celsius to form the P-body regions 250 in the epitaxial layer 230 surrounding the trench gates 245. The body implant allows for good contact to the body regions and also ensures a MOSFET channel region is preserved above the gate sidewall implants 235-S. In FIG. 13K, a source dopant implant is carried out. A source implant mask (not shown) is optionally applied to protect the locations to form the P-body contact. The source implant is carried out with source dopant ions such as arsenic ions with a dosage about 4E15 at an energy about 70 KeV at a zero degree tilt followed by a source anneal operation at a temperature of approximately 800 to 950 degrees Celsius to diffuse the source regions 255. In FIG. 13L, a dielectric layer 260 that by a Low Temperature Oxide deposition (LTO) and borophosphosilicate glass (BPSG) layer 260 is formed on the top surface followed by a BPSG flow process. Then a contact mask (not shown) is applied to carry out an oxide etch to etch the contact openings through the BPSG layer 260. A P+ body contact implant is carried out as an optional step followed by a reflow after the body contact implant. In FIG. 13M, a barrier metal deposition is carried out to cover the top surface with a barrier metal layer 265 followed by a thick metal deposition to form the source metal layer 270. A metal mask (not shown) is applied to etch and pattern the source metal 260 and gate metal (not shown). The processes are completed with the deposition of dielectric layers to passivate the device surface, and the patterning of the passivation layer to form the bond pad openings (not shown). A final alloy can then be performed. For the sake of brevity, these standard manufacturing processes are not specifically described here. In FIG. 13N, a backside grinding operation is carried out to remove the low doped portion of the substrate 205 from the bottom surface of the substrate then a back metal layer 210 is formed to contact the drain region 220 where the dopant concentration is higher. The back metal layer 210 may be formed by a deposition of TiNiAg layer directly on the backside of the wafers (below the drain contact region 220). The back grinding operation has a thickness control with a few microns and even down to one micron thus enables a reliable backside contact to form the drain electrode layer 210 to contact the N+ drain contact regions 220.

Although the present invention has been described in terms of the presently preferred embodiment, it is to be understood that such disclosure is not to be interpreted as limiting. Various alterations and modifications will no doubt become apparent to those skilled in the art after reading the above disclosure. By way of example, although the above embodiments show a n-channel device, this invention is easily applicable to p-channel devices by switching the conductivity types of the semiconductor regions. Accordingly, it is intended that the appended claims be interpreted as covering all alterations and modifications as fall within the true spirit and scope of the invention.

I claim:

1. A semiconductor power device comprising:
a semiconductor substrate including a plurality of deep trenches;
an epitaxial layer filling said deep trenches, the epitaxial layer further including a simultaneously grown top epitaxial layer covering areas above a top surface of said deep trenches and over said semiconductor substrate, wherein the epitaxial layer is of an opposite conductivity type as the semiconductor substrate;
a plurality of trench MOSFET cells disposed in said top epitaxial layer with the top epitaxial layer acting as the body region and the semiconductor substrate acting as the drain region whereby a super-junction effect is achieved through charge balance between the epitaxial layer in the deep trenches and regions in the semiconductor substrate laterally adjacent to the deep trenches; and
each of said plurality of trench MOSFET cells further including a trench gate and a gate-shielding dopant region disposed below and substantially aligned with each of the trench gates for each of the trench MOSFET cells for shielding the trench gate during a voltage breakdown, wherein the gate-shielding dopant region has an opposite conductivity type as the substrate.

2. The semiconductor power device of claim 1 wherein:
the gate-shielding dopant regions are disposed at a distance below a bottom surface of the trench gates and having no contact with said trench gates.

3. The semiconductor power device of claim 2 wherein:
each of said MOSFET transistor cells further having gate sidewall dopant regions surrounding sidewalls of said trench gate and a gate-bottom dopant region below said trench gate wherein the gate sidewall dopant regions and gate-bottom dopant regions are of a same conductivity type as the semiconductor substrate.

4. The semiconductor power device of claim 1 further comprising:
a gate-bottom dopant implant-region disposed below each of the trench gates implanted with a dopant having a same conductivity type as the substrate and are located above the gate-shielding dopant regions.

5. The semiconductor power device of claim 1 wherein:
the trench gates are located in the top epitaxial layer, between the deep trenches.

6. The semiconductor power device of claim 1 wherein:
each of said trench gates of said trench MOSFET cells extends through said top epitaxial layer and having a gate trench depth less than or equal to a thickness of said top epitaxial layer.

7. The semiconductor power device of claim 1 wherein:
each of the trench gates extends and penetrates through said top epitaxial layer into a top portion of said semiconductor substrate.

8. The semiconductor power device of claim 1 wherein:
said trench gate further comprising gate sidewall dopant regions surrounding sidewalls of said trench gate and a gate-bottom dopant region below said trench gate, wherein the gate sidewall dopant regions and gate-bottom dopant regions are of the same conductivity type as the semiconductor substrate.

9. The semiconductor power device of claim 1 wherein:
said semiconductor substrate further includes regions surrounding said deep trenches having a lateral doping concentration gradient with the concentration gradually decreasing from a region immediately next to sidewalls of the deep trenches.

10. The semiconductor power device of claim 1 further comprising:
a drain contact dopant region surrounding a bottom portion of said deep trenches near a bottom surface of said semiconductor substrate.

11. The semiconductor power device of claim 1 wherein:
the gate-shielding dopant regions constituting floating islands.

12. The semiconductor power device of claim 1 wherein:
the gate-shielding dopant regions are electrically connected to the body region of the MOSFET cells.

13. The semiconductor power device of claim 12 wherein:
the deep trenches extend to the bottom substrate.

14. The semiconductor power device of claim 12 wherein:
the deep trenches extend into a top portion of said substrate but do not reach the bottom portion of said substrate.

15. The semiconductor power device of claim 1 wherein:
said trench gates of said trench MOSFET cells and said deep trenches filled with said epitaxial layer therein further configured as stripes with said gate-shielding dopant regions disposed below stripes of said trench gates as floating dopant regions.

16. The semiconductor power device of claim 1 wherein:
said trench gates of said trench MOSFET cells further configured as stripes with tabs extending toward said deep trenches filled with said epitaxial layer therein for electrically connecting said gate-shielding dopant regions under the extended trench gates to a body region of said transistor cells through said epitaxial layer disposed in said epitaxial trenches.

17. The semiconductor power device of claim 1 wherein:
said trench gates of said MOSFET transistor cells further configured as stripes with offset tabs extending alternately on opposite sides of said trench gates toward said deep trenches filled with said epitaxial layer for electrically connecting said gate-shielding dopant regions under the trench gates tabs to a body region of said transistor cells through said epitaxial layer disposed in said deep trenches.

18. The semiconductor power device of claim 1 wherein:
the semiconductor substrate further comprises a heavily doped bottom substrate and a lightly doped top substrate grown on top of the bottom substrate, wherein the deep trenches are substantially formed in the top substrate.

19. A semiconductor power device comprising:
a semiconductor substrate including deep trenches;
a single epitaxial layer which fills the deep trenches and covers the top surface of the semiconductor substrate; and
a plurality of trench MOSFET cells formed in the top portion of the epitaxial layer over the semiconductor surface, wherein the portion of the semiconductor substrate lateral to the deep trenches functioning as a drift layer of the trench MOSFET cells and wherein trench gates of said trench MOSFET cells are formed in the portions of the epitaxial layer over the drift region between the deep trenches, and wherein the semiconductor power device achieves a super-junction effect through charge-balance between the drift region and the portion of the epitaxial layer in the deep trenches; and a gate-shielding dopant region disposed below and substantially aligned with each of the trench gates for each of the trench MOSFET cells for shielding the trench gate during a voltage breakdown.

20. The semiconductor power device of claim 19 wherein:
the gate-shielding dopant regions are disposed at a distance below a bottom surface of the trench gates and having no contact with said trench gates.

* * * * *